(12) United States Patent
Tanaka et al.

(10) Patent No.: US 6,781,890 B2
(45) Date of Patent: Aug. 24, 2004

(54) NONVOLATILE MEMORY AND PROCESSING SYSTEM

(75) Inventors: Hitoshi Tanaka, Ome (JP); Masanori Isoda, Sayama (JP); Takayuki Kawahara, Higashiyamato (JP)

(73) Assignees: Renesas Technology Corp., Tokyo (JP); Hitachi ULSI Systems, Co., Ltd., Tokyo (JP)

( * ) Notice: Subject to any disclaimer, the term of this patent is extended or adjusted under 35 U.S.C. 154(b) by 91 days.

(21) Appl. No.: 10/308,106

(22) Filed: Dec. 3, 2002

(65) Prior Publication Data

US 2003/0111682 A1 Jun. 19, 2003

(30) Foreign Application Priority Data

Dec. 14, 2001 (JP) ........................................ 2001-381428

(51) Int. Cl.[7] .............................................. G11C 7/00
(52) U.S. Cl. ............................ 365/189.09; 365/185.33; 365/226
(58) Field of Search ............................ 365/185.18, 226, 365/189.09, 189.11, 203, 185.33; 327/536, 537; 363/59, 60

(56) References Cited

U.S. PATENT DOCUMENTS

| 5,394,372 A | * | 2/1995 | Tanaka et al. | ............... | 365/226 |
| 5,600,163 A | * | 2/1997 | Yano et al. | .................. | 257/314 |
| 6,473,321 B2 | * | 10/2002 | Kishimoto et al. | ........... | 363/59 |
| 6,588,673 B1 | * | 7/2003 | Chan et al. | .................. | 235/492 |
| 6,643,193 B2 | * | 11/2003 | Yamaki et al. | ......... | 365/189.09 |

OTHER PUBLICATIONS

J. Shin et al., "A New Charge Pump Without Degradation in Threshold Voltage Due to Body Effect", *IEEE Journal of Solid–State Circuits*, vol. 35, No. 8, Aug. 2000, pp. 1227–1230.

H. Morimura et al., "A Step–Down Boosted–Wordline Scheme for 1–V Battery–Operated Fast SRAM's", *IEEE Journal of Solid–State Circuits*, vol. 33, No. 8, Aug. 1998, pp. 1220–1227.

C. Lauterbach et al., "Charge Sharing Concept and New Clocking Scheme for Power Efficiency and Electromagnetic Emission Improvement of Boosted Charge Pumps", *IEEE Journal of Solid–State Circuits*, vol. 35, No. 5, May 2000, pp. 719–723.

* cited by examiner

*Primary Examiner*—Gene N. Auduong
(74) *Attorney, Agent, or Firm*—Miles & Stockbridge P.C.

(57) ABSTRACT

It is an object of the present invention to allow a voltage generating section which produces a high voltage to efficiently produce a high voltage, and to reduce a layout area of a semiconductor chip. An intermediate voltage charge pump circuit is provided in a voltage producing section of a flash memory. The intermediate voltage charge pump circuit comprises switching elements, a first charge pump circuit comprising capacitors, a second charge pump circuit comprising switching elements, capacitors and an equalizer comprising switching elements. These elements are driven by driving signals. A period during which all of one contacts of parasitic capacities Capacitor are brought into floating state temporarily is formed. After corresponding parasitic capacities are short-circuited by the switching elements, nodes thereof are electrically charged or discharged, and a high voltage is produced while reusing electric charge while using electric charge discharged to a reference potential by next cycle.

10 Claims, 30 Drawing Sheets

V(A)<V(B)<V(C)

V(A)>V(B)>V(C)

REFERENCE POINT

☐ nWELL
▨ GATE ELECTRODE LAYER
▨ DISPERSION LAYER
▫ CONTACT HOLE

NONVOLATILE MEMORY AND PROCESSING SYSTEM

TECHNICAL FIELD OF THE INVENTION

The present invention relates to a nonvolatile memory (nonvolatile semiconductor memory device) and a processing system and more particularly to a technique effectively applied for producing a high voltage in a flash memory or an EEPROM (Electrically Erasble Programmable Read Only Memory).

BACKGROUND OF THE INVENTION

For example, a flash memory or an EEPROM flush includes a voltage boosting circuit as a circuit for producing a boosted voltage which is higher than a power source voltage used for rewriting data.

In this voltage boosting circuit, a Dickson type (parallel type, hereinafter) or a switched capacitor type (serial type, hereinafter) charge pump circuit is known.

As shown in FIG. 33, boosted capacities CB1 to CBn comprising a plurality of depression type MOS (Metal Oxide Semiconductor) transistors are connected to the parallel type charge pump circuit in series. A power source voltage VDD is applied to a first stage boosted capacitance CB1 and thereafter, gradually higher voltages, e.g., 2VDD, 3VDD are applied to the subsequent capacities, and a high voltage (n−1) VDD is applied to the final stage boosted capacitance. Here, "n" is a boosting rate when no load is applied to the charge pump circuit.

In the case of the serial type charge pump circuit, as shown in FIG. 34, a power source voltage VDD is charged to boosted capacities CB1 to CB1-$n$ and then, all of n−1 electrostatic capacities are connected in series. At that time, an nVPP voltage is obtained under a condition that a load current is zero.

An example describing the Dickson type charge pump circuit in detail is Jongshin Shin, "A New Charge Pump Without Degradation in Threshold Voltage Due to Body Effect," IEEE JOURNAL OF SOLID-STATE CIRCUITS, VOL. 35, NO. 8, AUGUST 2000 pp. 1227–1230. Examples describing the switched capacitor type charge pump circuit in detail are Hiroki Morimura, "A Step-Down Boosted-Wordline Scheme for 1-V Batter Operated Fast SRAM's," IEEE JOURNAL OF SOLID-STATE CIRCUIT, VOL. 33, NO. 8, AUGUST 1998 pp. 1220–1227.

SUMMARY OF THE INVENTION

The present inventors have found that a producing technique of the boosted power source voltage using the above-described voltage boosting circuit has the following problem.

In the parallel type, a (n−1)VDD voltage is applied to the boosted capacitance at the maximum as described above. On the other hand, a film thickness of an insulating film which can be used in semiconductor integrated circuit device is limited to about two kinds because process stage is complicated and cost is increased.

Therefore, in the case of the thickness of the insulating film of the boosted capacitance, if a voltage exceeds a limit of voltage resistance of a thinner insulating film, all of remaining insulating films must use thick films, and as the number of voltage boosting stages is increased, the number of boosted capacities of the insulating films is increased, so that an area occupied by the boosted capacities is adversely increased.

In a flash memory, especially in a multilevel flash memory in which 2 bit or more information is stored in one memory cell, it is difficult to lower a voltage which is to be applied to a memory cell at the time of writing or erasing even if an outside power source voltage is lowered. In order to generate a necessary voltage to be applied to the memory cell, it is necessary to increase the voltage boosting stages, and if the voltage increasing stages are increased, the area is considerably increased.

Four voltage boosting stages suffice for generating 4V to 7V boosted voltage of power source voltage, but when 18V of power source voltage is to be generated, seven voltage increasing stages are required. Further, since the amount of electric charge per one boosted capacitance is reduced, capacitance value per one boosted capacitance must be increased, and total 3.6 times capacitance values are required as compared with a case in which the boosted voltage is 3V.

The parallel type has a problem that its area is increased because most of the boosted capacities must use thick insulating film. In the case where two kinds of, i.e., 8 nm and 25 nm insulating films are used, it is necessary that a maximum permissible electric field of the insulating film is 5 MV/cm (when $SiO_2$ is used for the insulating film), a 25 nm insulating film is used from third stage when the power source voltage VDD is 1.8V.

On the other hand, in the serial type, all of the insulating films can use thin films. In this type, as described above, after the power source voltage VDD is charged to boosted capacities CB1 to CBn−1, all of the n−1 boosted capacities are connected in series. Therefore, voltage resistance of the boosted capacitance may be power source voltage VDD.

For example, when a permissible value of the power source voltage is 1.8V±0.2V and a maximum permissible electric field of the insulating film is 5 MV/cm, the insulating film can be made thin to 4 nm. Therefore, its area can be reduced.

However, the serial type has the following problem.

In the charge pump circuit, it is important to reduce a ratio of input current and output current as small as possible. In an ideal n-times voltage charge pump circuit, the following equation is established between input current IPP and output current IOUT:

$$IDD = nIOUT \quad \text{(equation 1)}$$

In an actual case, however, redundant current flows due to a dispersion layer of a MOS capacitance, capacitance against substrate of a well, or parasitic capacitance in a drive circuit. Especially in the serial type, since n-times voltage of a power source voltage VDD is applied to a parasitic capacitance Cp parasitized to the boosted capacitance. Therefore, there is a problem that waste current discharged by them becomes greater than that of the parallel type, and the input and output current ratio becomes much greater than an ideal value n.

It is an object of the present invention to provide a nonvolatile memory and a processing system in which a voltage generating section for producing a high voltage can produce high voltage efficiently, and a layout area of a semiconductor chip can be reduced.

The above and other objects and new features of the present invention will be apparent from the description of this specification and accompanying drawings.

An outline of a representative invention disclosed in this application will be explained briefly below.

The present invention provides a producing technique of a high voltage in a nonvolatile semiconductor memory device, the nonvolatile semiconductor memory device comprises a memory array having a plurality of nonvolatile memory cells, a control section, and a voltage producing section for supplying a predetermined voltage to be supplied to the nonvolatile memory cell, wherein the voltage producing section comprises an operation signal producing section for producing a predetermined voltage to be applied to the memory cells in each of the operations in accordance with control from the control section, and a plurality of voltage generating sections, the operation signal producing section produces various operation signals to be supplied to the plurality of voltage generating sections, the voltage generating section comprises a serial type first charge pump circuit for producing a boosted voltage based on a first operation signal, a serial type second charge pump circuit for producing a boosted voltage based on a second operation signal, and an equalizer for short-circuiting parasitic capacities of the first and second charge pump circuits based on a third operation signal during a floating state of the corresponding parasitic capacities parasitized to the boosted capacities of the first and second charge pump circuits when the boosted voltage produced by the first or second charge pump circuit is output.

An outline of another invention of this application will be described briefly.

1. A Nonvolatile Semiconductor Memory Device:

A nonvolatile semiconductor memory device comprises a memory array having a plurality of nonvolatile memory cells, a control section, and a voltage producing section for supplying a predetermined voltage to be supplied to the nonvolatile memory cell, wherein the voltage producing section comprises an operation signal producing section for producing a predetermined voltage to be applied to the memory cells in each of the operations in accordance with control from the control section, and a plurality of voltage generating sections, the operation signal producing section produces various operation signals to be supplied to the plurality of voltage generating sections, the voltage generating section comprises a third charge pump circuit having a parallel type parasitic capacitance provided at its preceding stage and a plurality of serial type pump circuits connected to its following stage, the third charge pump circuit producing a boosted voltage based on the first operation signal, a fourth charge pump circuit having a parallel type parasitic capacitance provided at its preceding stage and a plurality of serial type pump circuits connected to its following stage, the fourth charge pump circuit producing a boosted voltage based on the second operation signal, and an equalizer for short-circuiting parasitic capacities of the first and second charge pump circuits based on a third operation signal during a floating state of the corresponding parasitic capacities parasitized to the boosted capacities of the first and second charge pump circuits when the boosted voltage produced by the third and fourth charge pump circuit is output.

2. A Processing System:

A processing system comprises a nonvolatile memory section and a central processing unit, the central processing unit can carry out a predetermined processing, and can give operation instructions to the nonvolatile memory section, wherein the nonvolatile memory section comprises a plurality of nonvolatile memory cells for storing information, and a voltage producing section, the voltage producing section comprises an operation signal producing section and a plurality of voltage generating sections, the voltage generating section comprises, a third charge pump circuit having a parallel parasitic capacitance provided at its preceding stage and a plurality of serial pump circuits connected to its following stage, said third charge pump circuit producing a boosted voltage based on the first operation signal, a fourth charge pump circuit having a parallel parasitic capacitance provided at its preceding stage and a plurality of serial pump circuits connected to its following stage, said fourth charge pump circuit producing a boosted voltage based on the second operation signal, and an equalizer for short-circuiting parasitic capacities of said first and second charge pump circuits based on a third operation signal during a floating state of the corresponding parasitic capacities parasitized to the boosted capacities of said first and second charge pump circuits when the boosted voltage produced by said third or fourth charge pump circuit is output.

BRIEF DESCRIPTION OF THE DRAWINGS

FIG. 24 is an explanatory diagram showing one example of a cross section structures of various MOS devices used in the flash memory shown in FIG. 3, FIGS. 25A–25C are an explanatory diagram showing a layout example of a unit cell used in the electric charge reusing serial type charge pump circuit shown in FIG. 11, wherein

DESCRIPTION OF THE PREFERRED EMBODIMENTS

Embodiments of the present invention will be explained below in detail based on the drawings.

Figure 1:
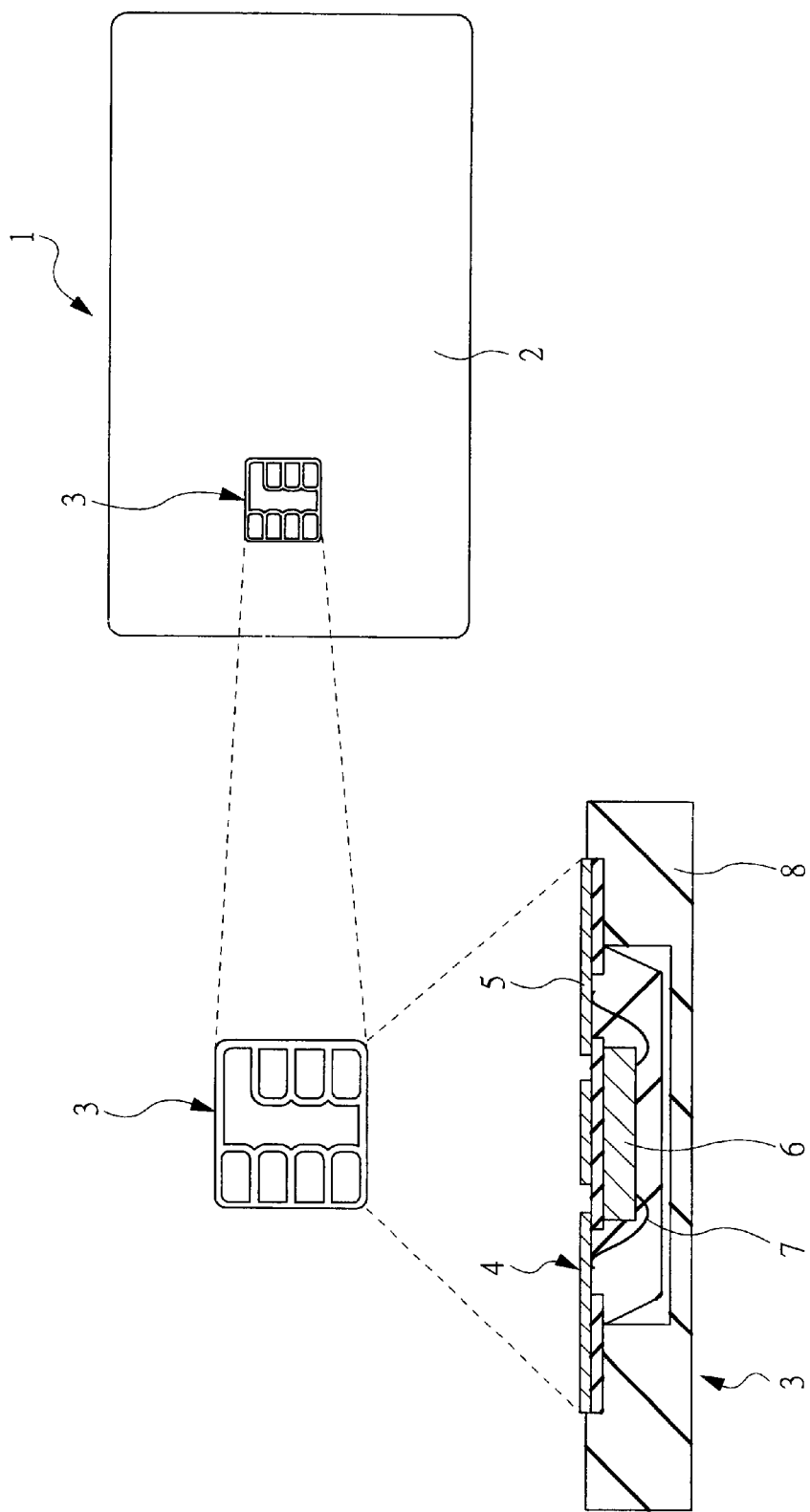
FIG. 1 is an explanatory diagram of an IC card according to an embodiment of the present invention.
Figure 2:
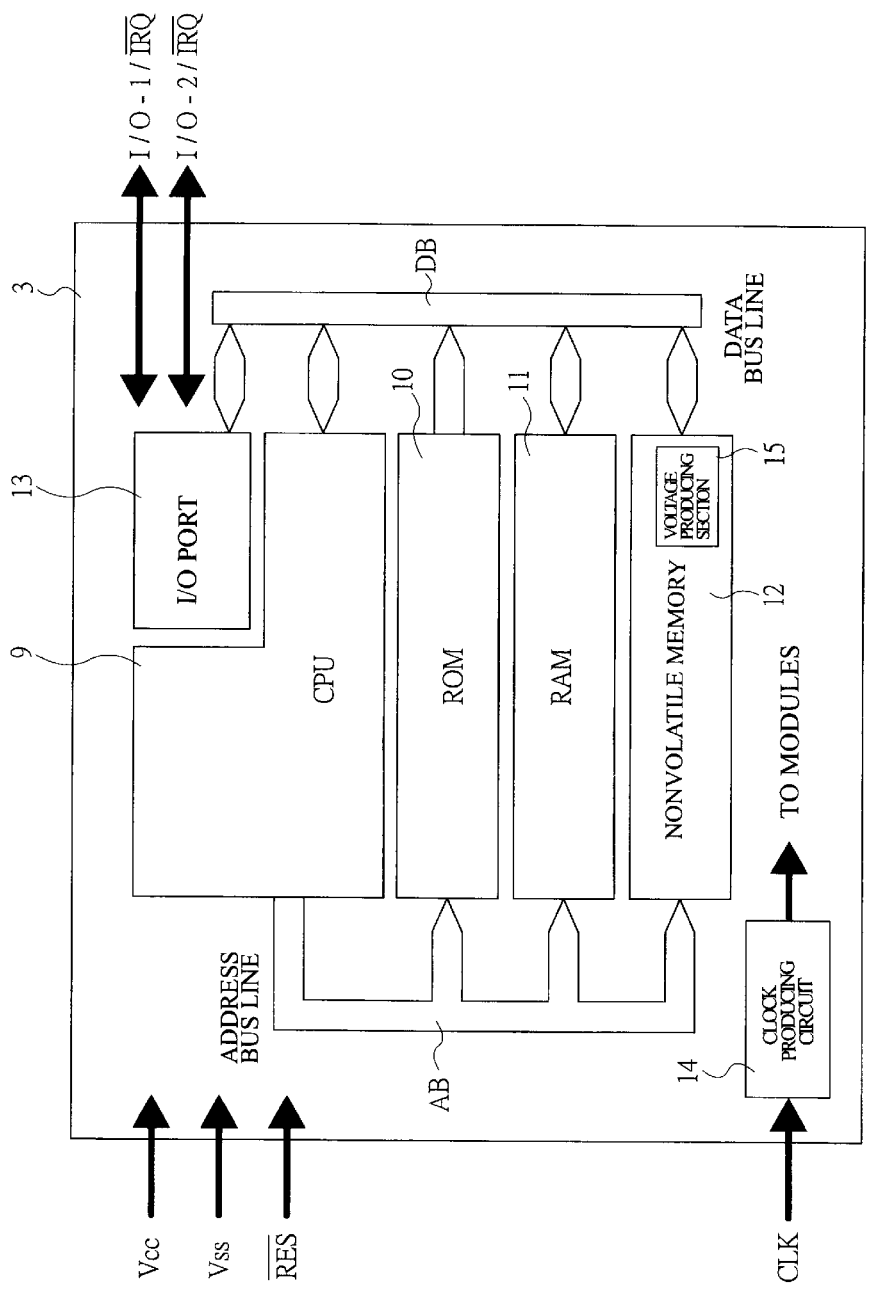
FIG. 2 is a block diagram of a semiconductor integrated circuit device provided in the IC card shown in FIG. 1.
Figure 3:
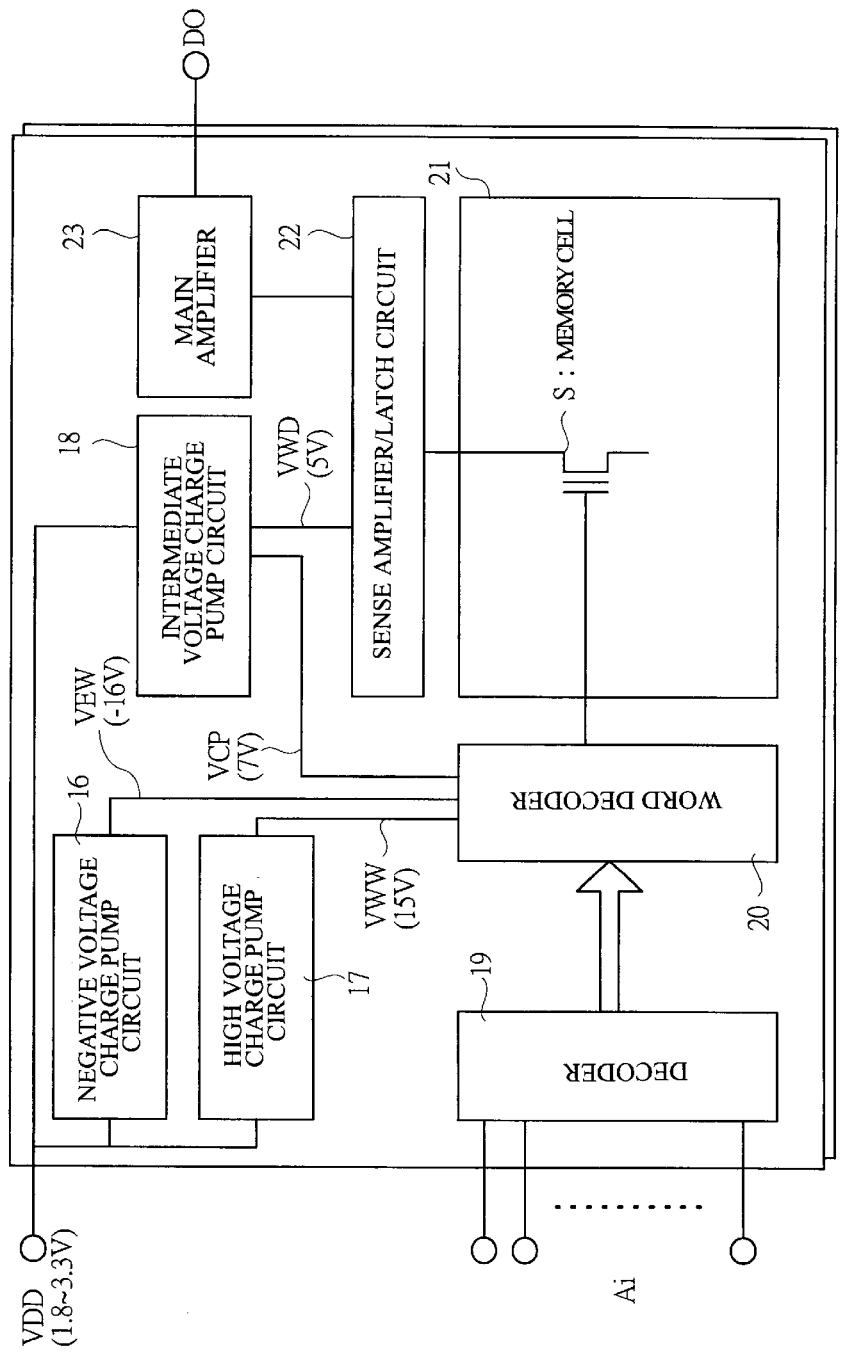
FIG. 3 is a schematic block diagram of a flash memory provided in the semiconductor integrated circuit device shown in FIG. 2.
Figure 4:
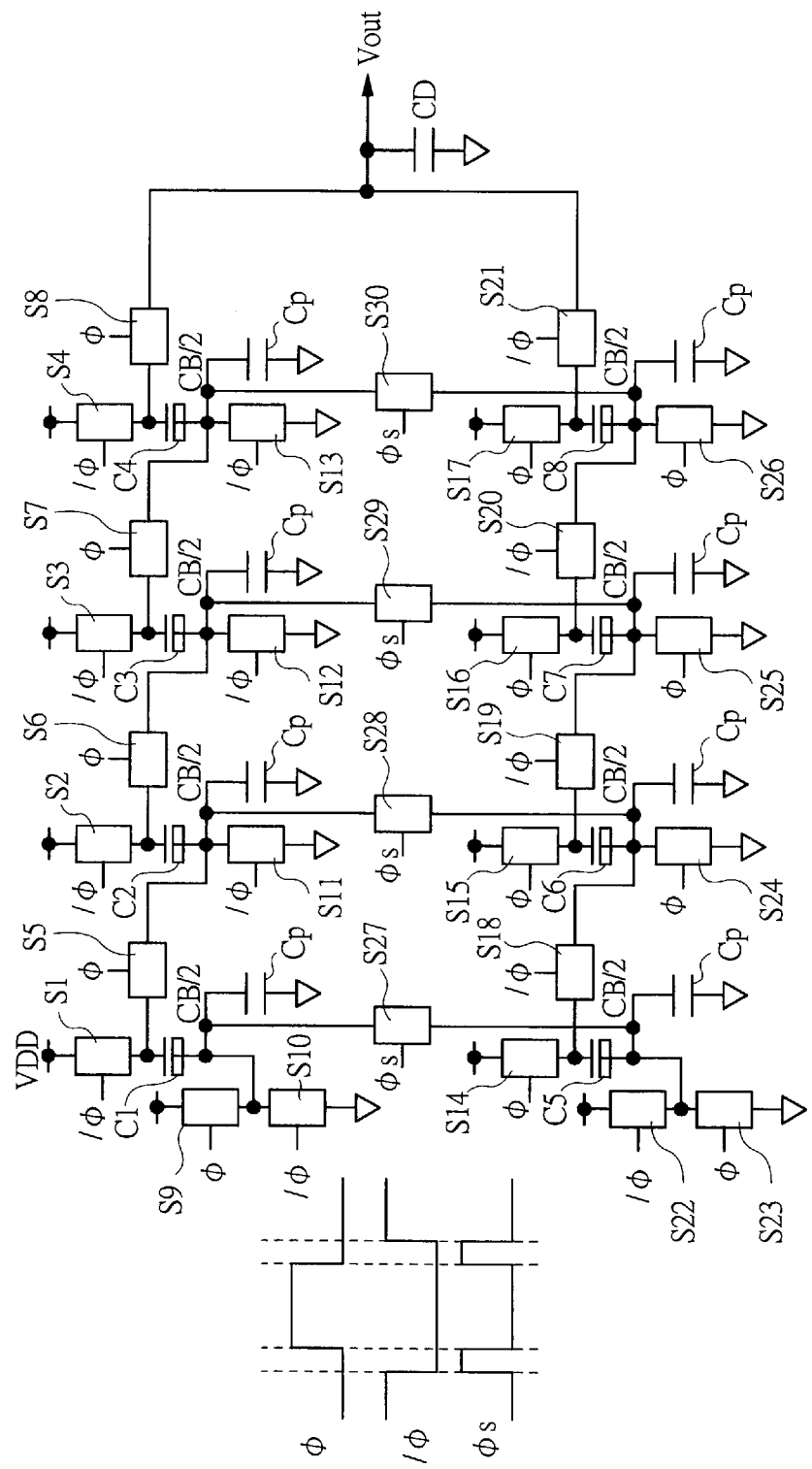
FIG. 4 is a schematic circuit diagram of an electric charge reusing serial type charge pump circuit according to an embodiment of the present invention.
Figure 5:
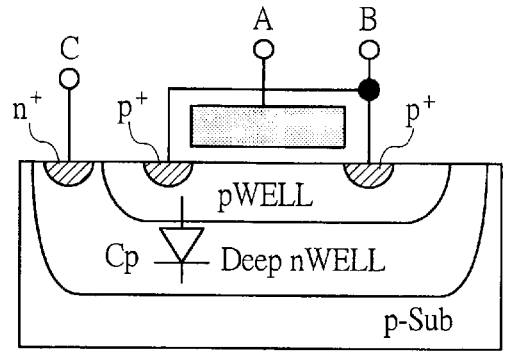
FIG. 5 is a sectional view showing one example of a capacitor used in the charge pump circuit according to an embodiment of the invention.
Figure 6:
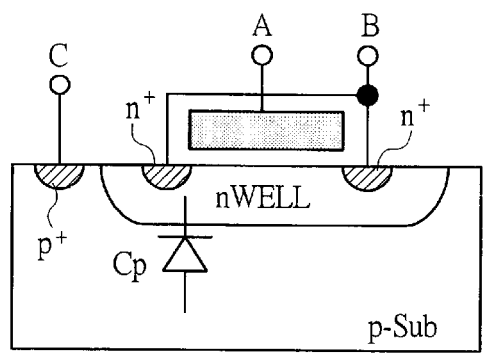
FIG. 6 is a sectional view showing another example of the capacitor used in the charge pump circuit according to an embodiment of the invention.
Figure 7:
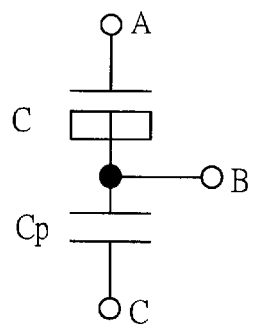
FIG. 7 is an equivalent circuit diagram of the capacitor shown in FIGS. 5 and 6.
Figure 8:
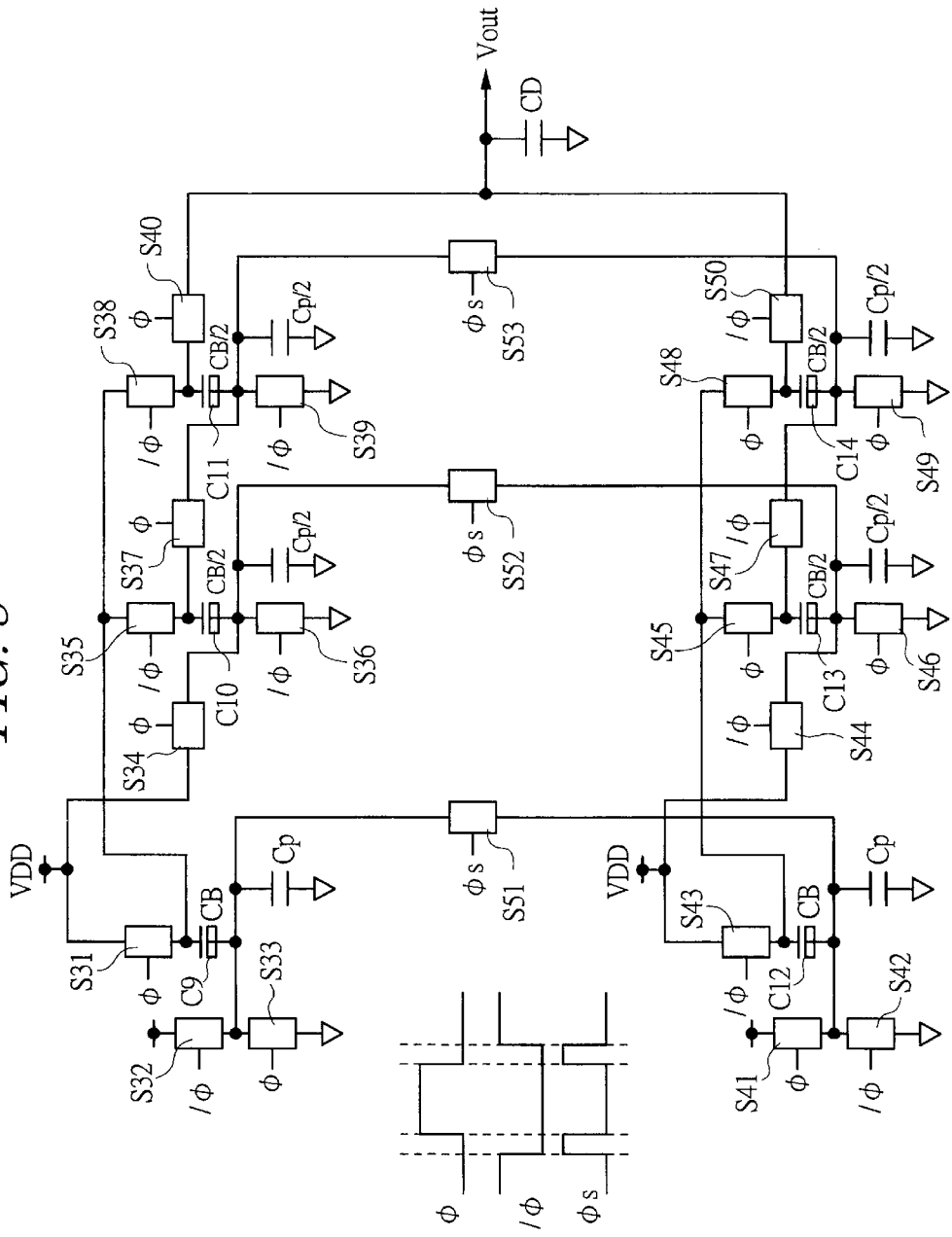
FIG. 8 is a schematic circuit diagram of an electric charge reusing serial/parallel type charge pump circuit according to an embodiment of the invention.
Figure 9:
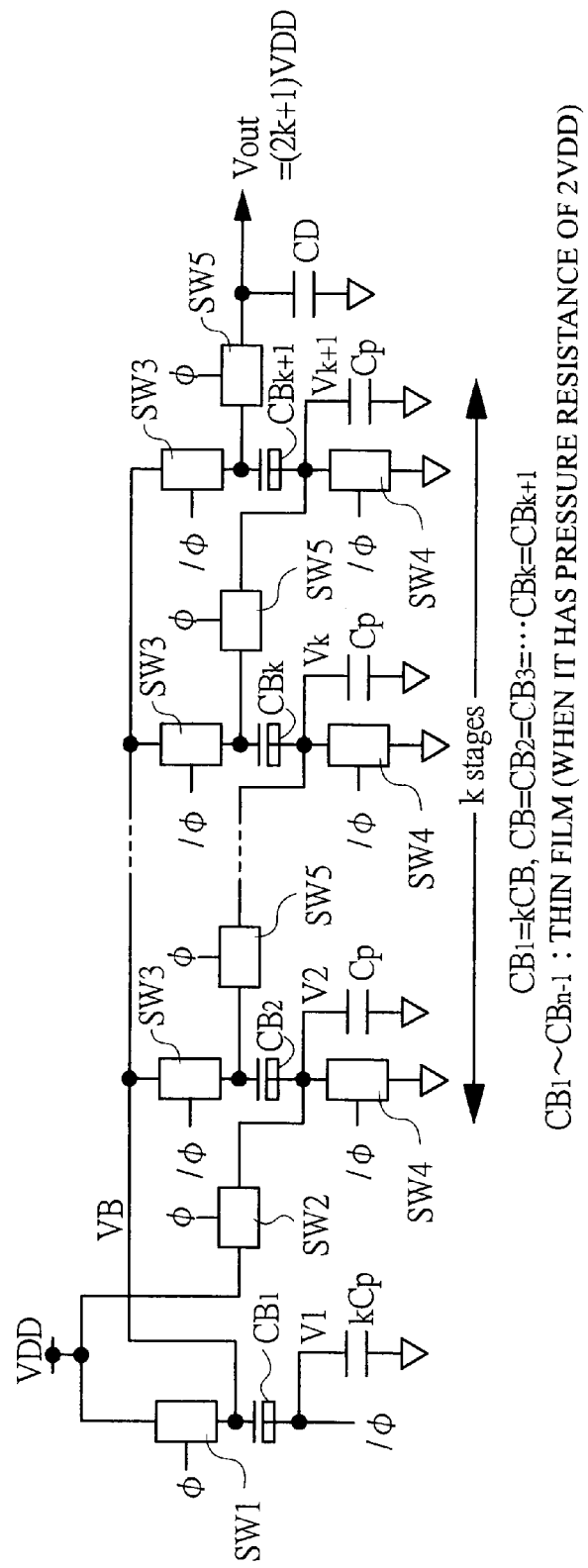
FIG. 9 is a schematic circuit diagram of a serial/parallel charge pump circuit according to an embodiment of the invention.
Figure 10:
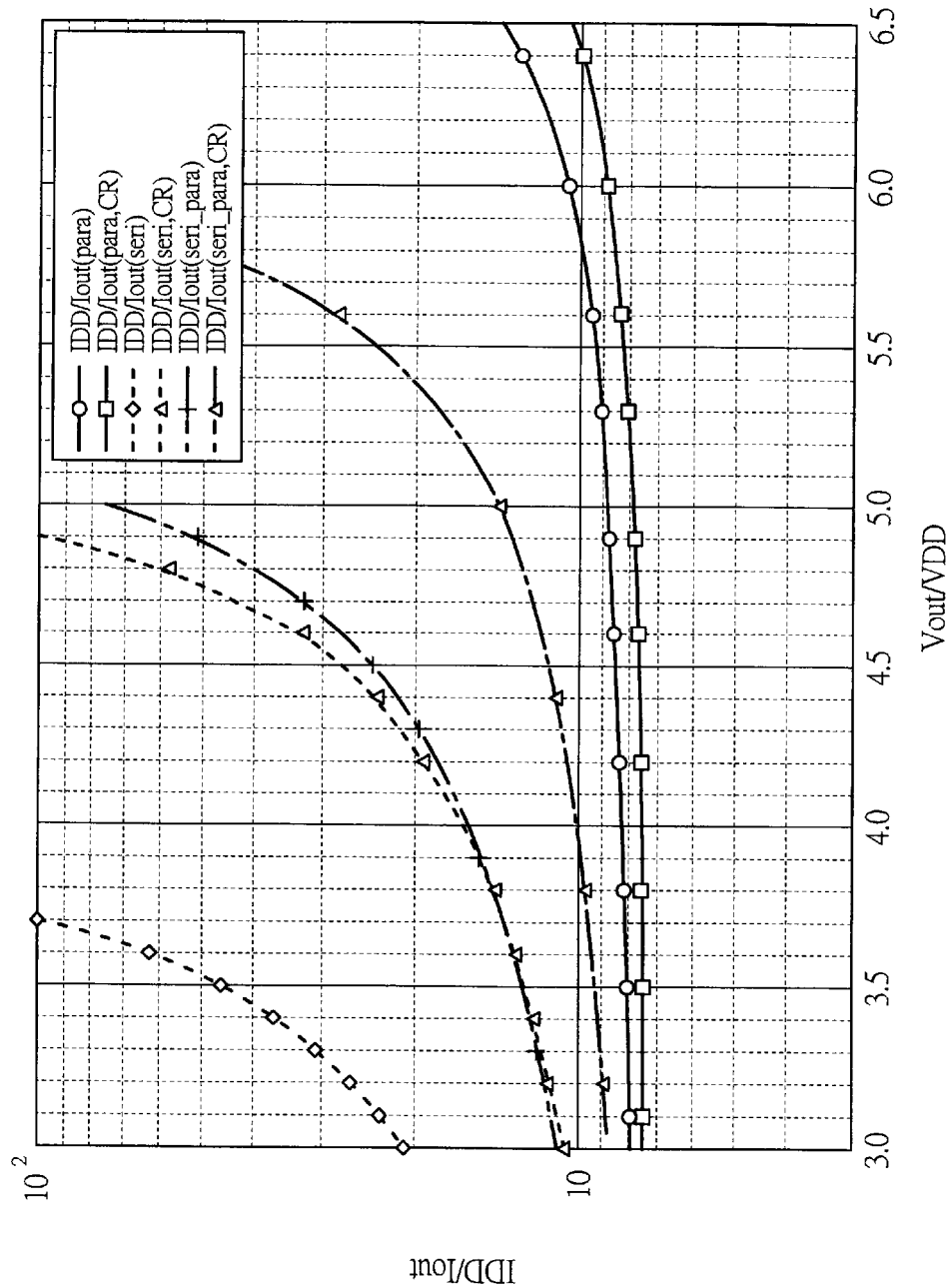
FIG. 10 is an explanatory diagram showing characteristics of input current/output current-boosting rate of various charge pump circuits.
Figure 11:
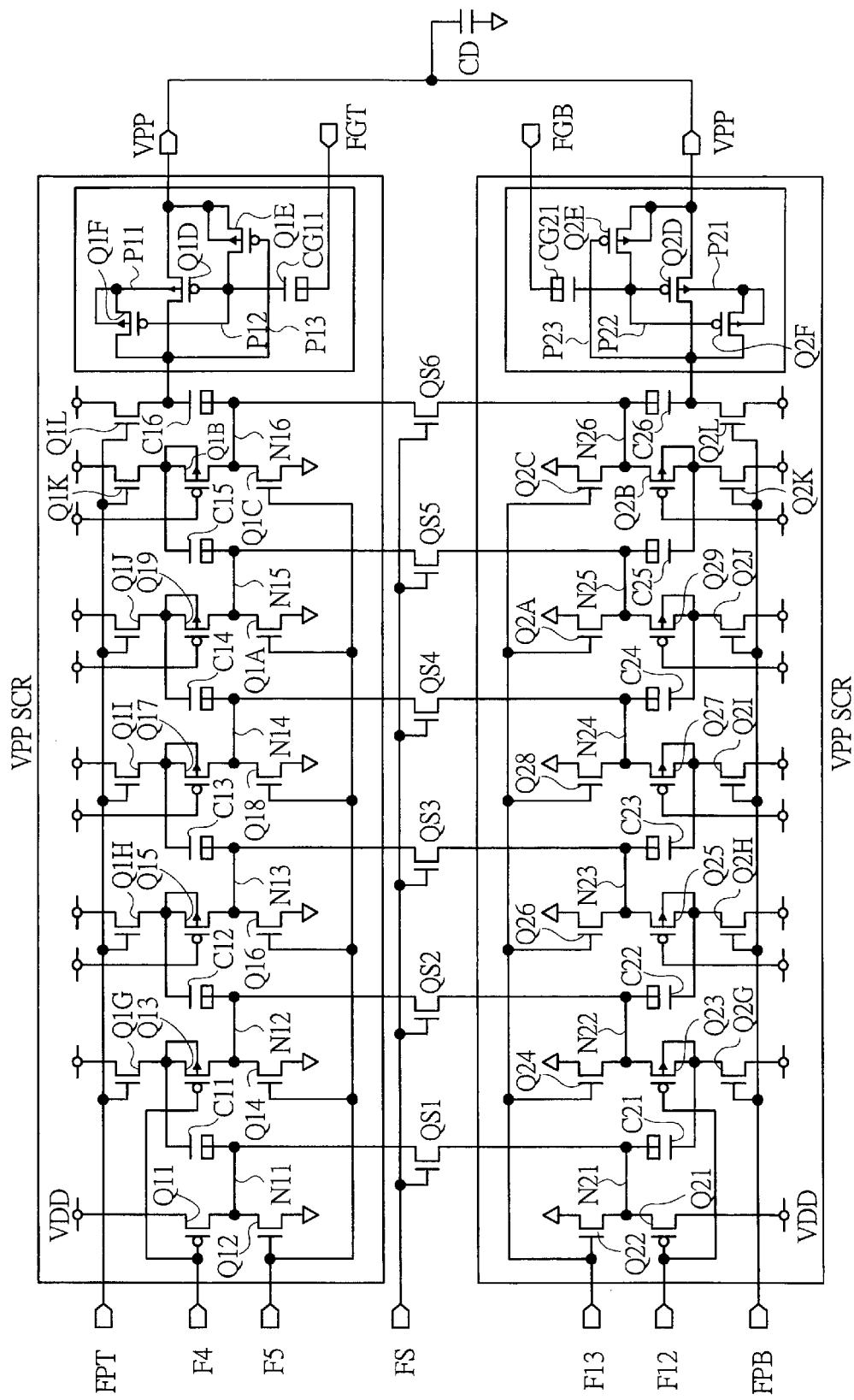
FIG. 11 is a circuit diagram of an electric charge reusing serial type charge pump circuit used in an intermediate voltage charge pump circuit of the flash memory shown in FIG. 3.
Figure 12:
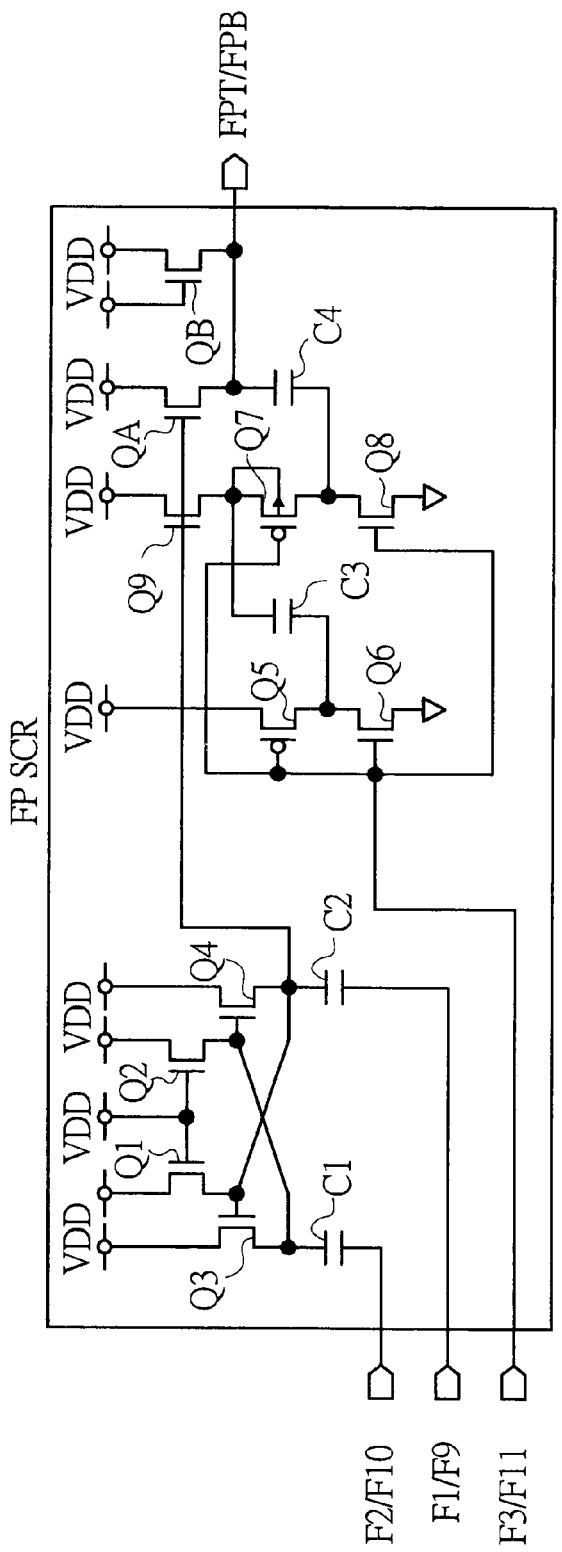
FIG. 12 is a circuit diagram of a precharge signal generating circuit for generating a precharge signal which is to be input to the electric charge reusing serial type charge pump circuit shown in FIG. 11.
Figure 13:
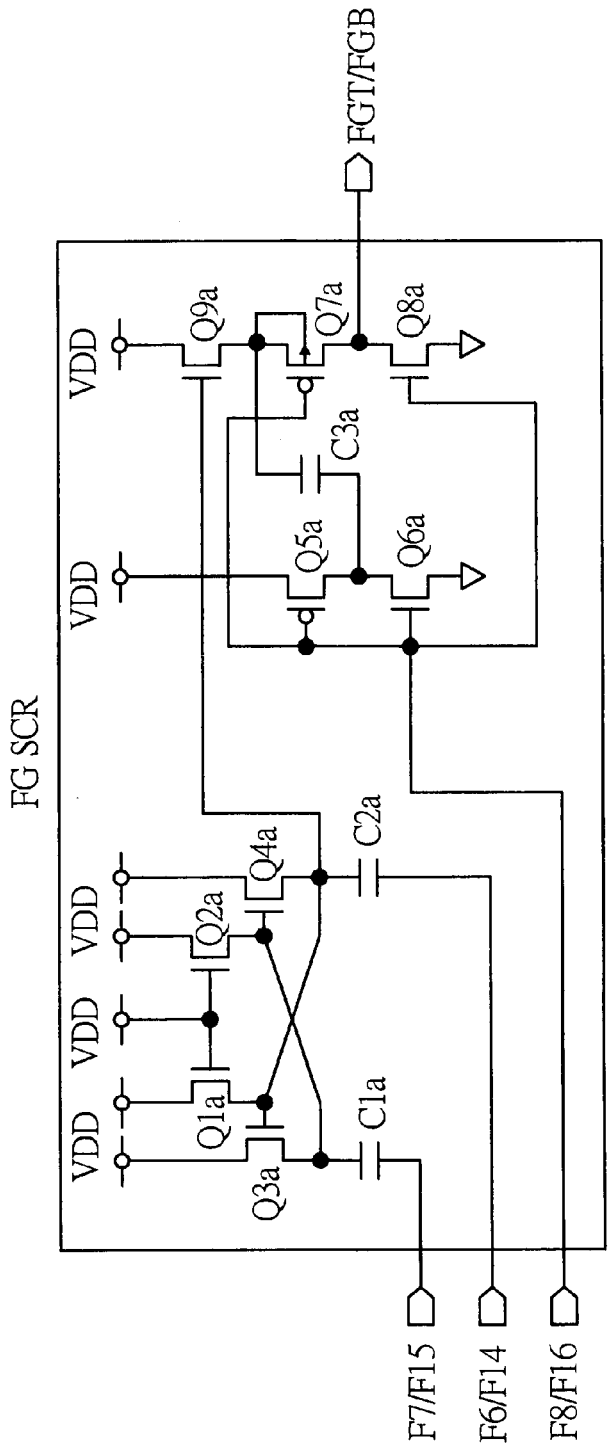
FIG. 13 is a circuit diagram of a final stage transfer transistor gate signal generating circuit for generating a final stage transfer transistor gate signal which is to be input to an electric charge reusing serial type charge pump circuit shown in FIG. 11.
Figure 14:
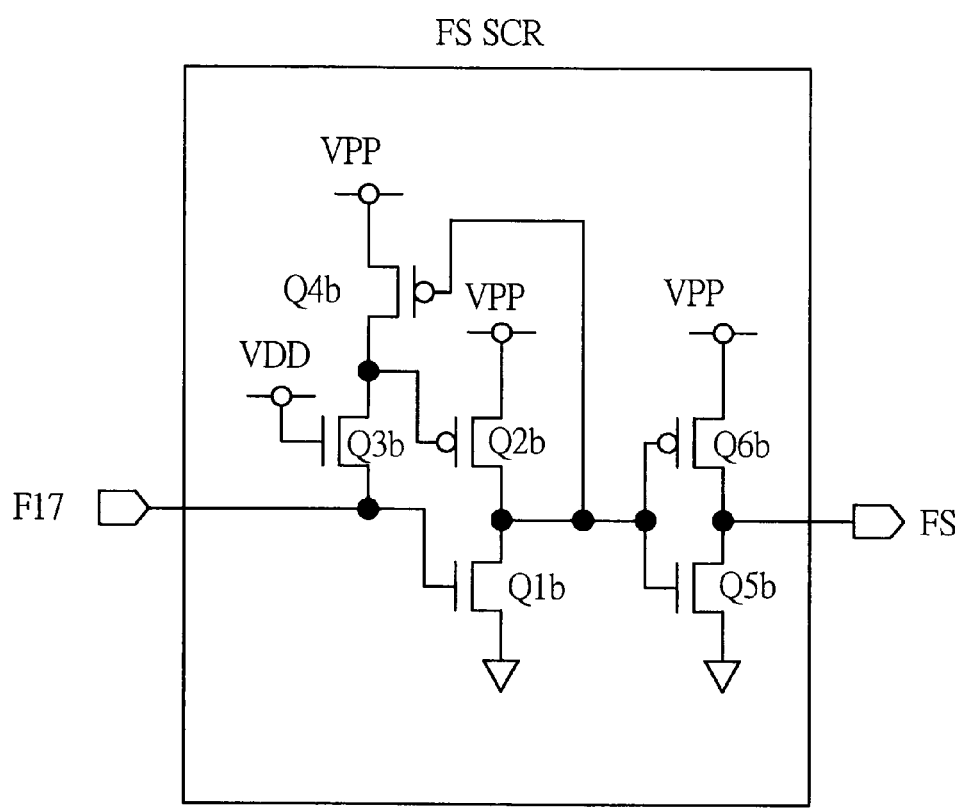
FIG. 14 is a circuit diagram of an equalizing signal generating circuit for generating an equalizing signal which is to be input to the electric charge reusing serial type charge pump circuit shown in FIG. 11.
Figure 15:
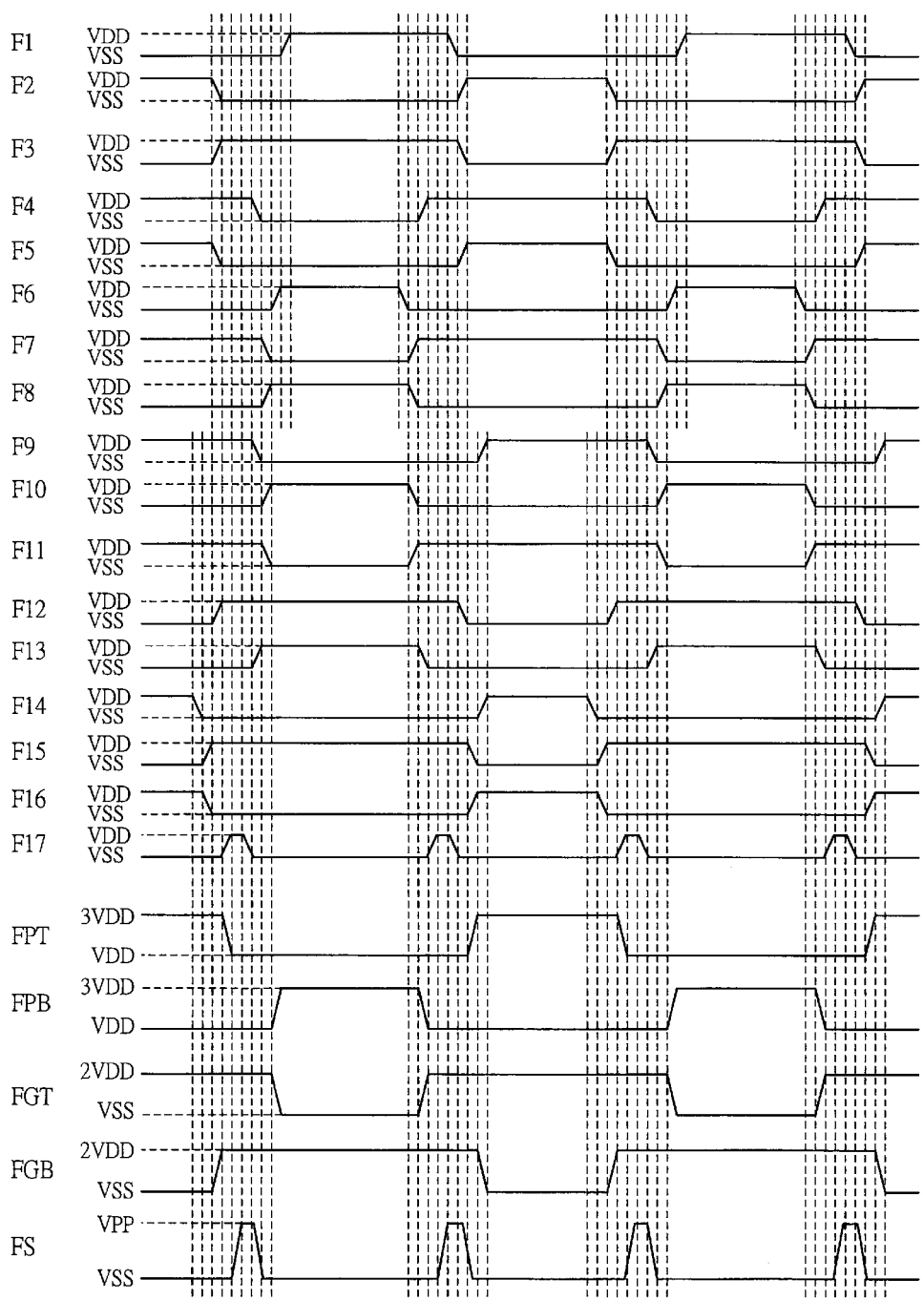
FIG. 15 is a timing chart of various signals in the electric charge reusing serial type charge pump circuit in FIG. 11.
Figure 16:
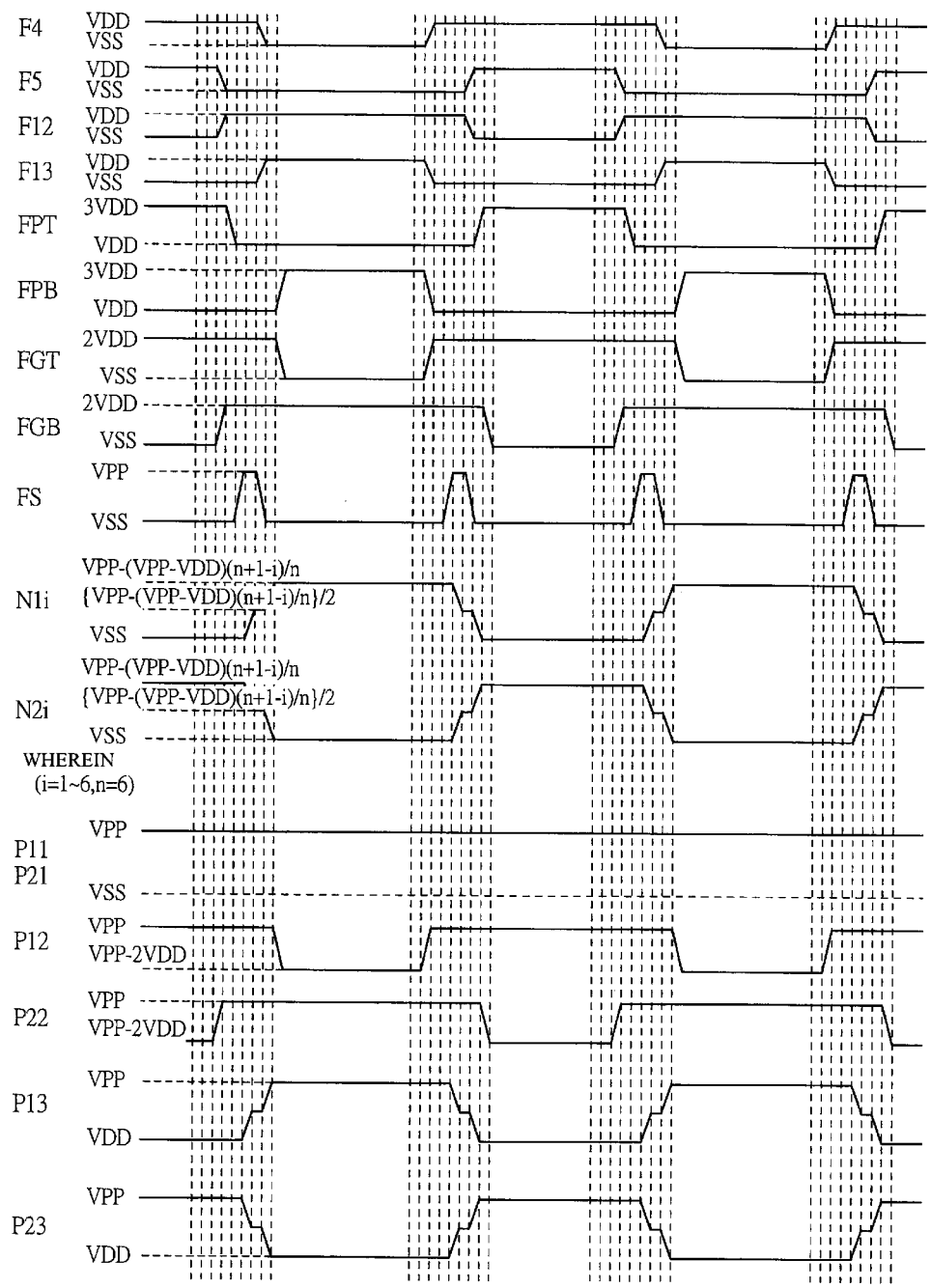
FIG. 16 is a timing chart of other various signals in the electric charge reusing serial type charge pump circuit in FIG. 11.
Figure 17:
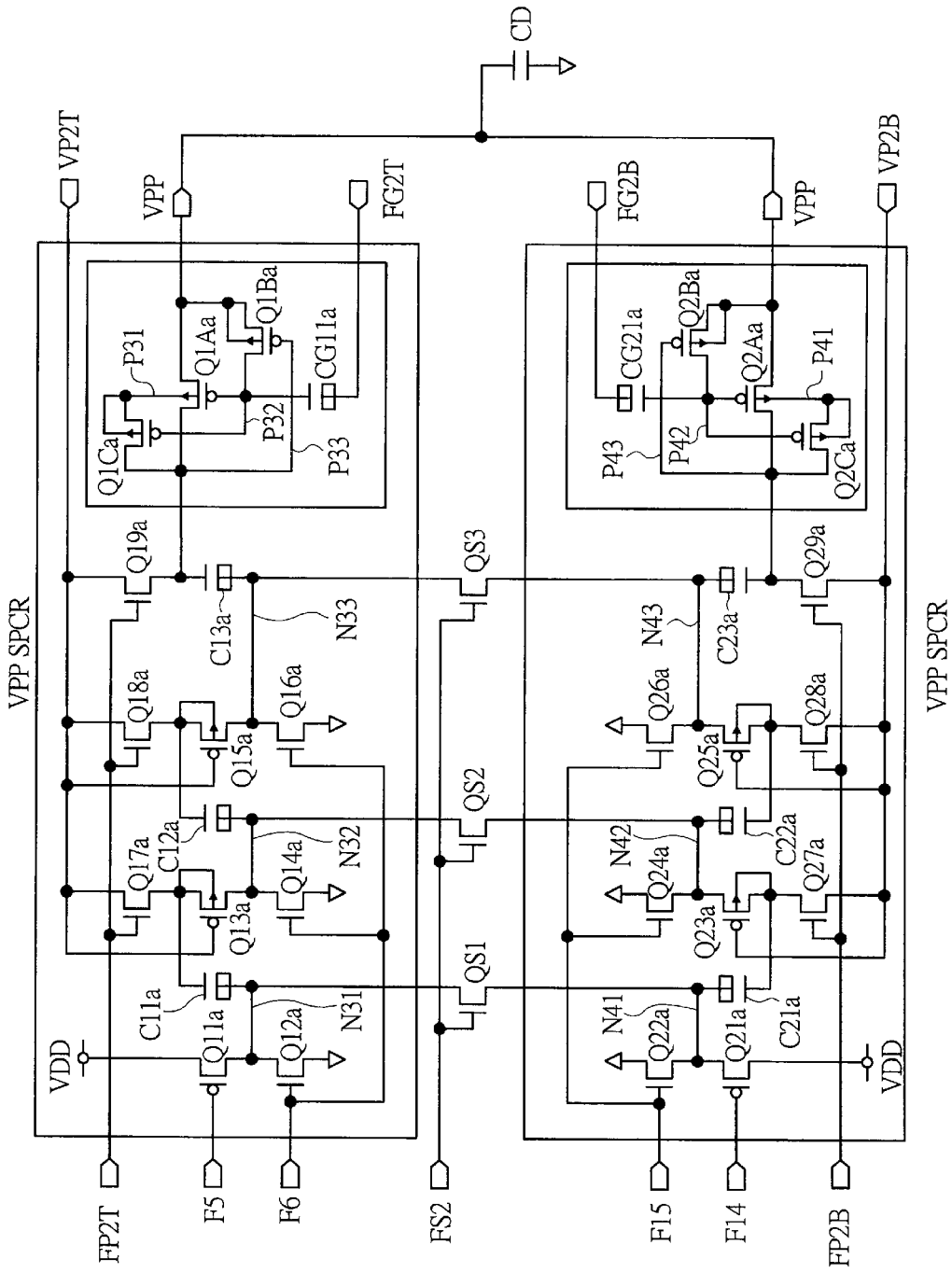
FIG. 17 is a circuit diagram of an electric charge reusing serial/parallel type charge pump circuit used in the intermediate voltage charge pump circuit of the flash memory shown in FIG. 3.
Figure 18:
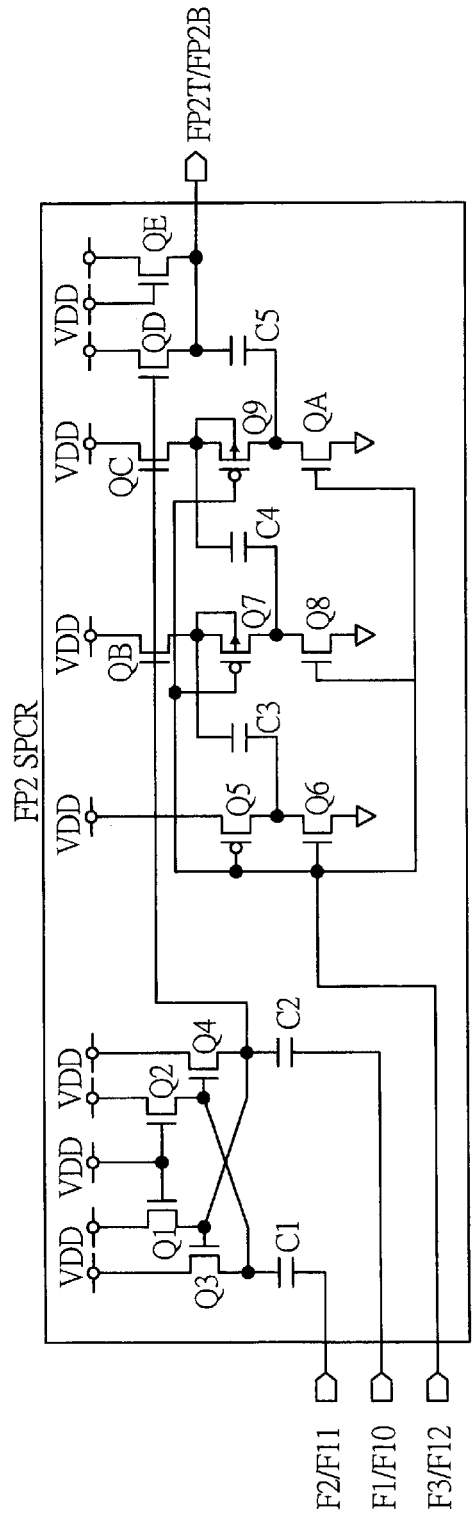
FIG. 18 is a circuit diagram of a precharge signal generating circuit for generating a precharge signal which is to be input to the electric charge reusing serial type charge pump circuit shown in FIG. 17.
Figure 19:
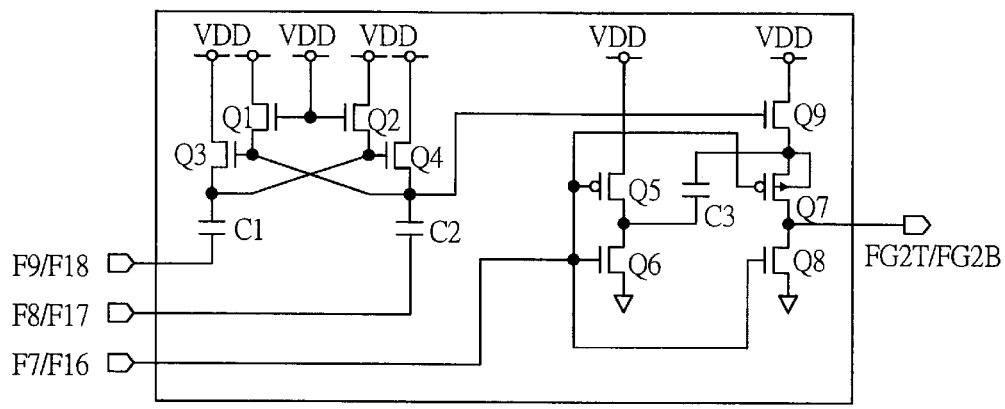
FIG. 19 is a circuit diagram of a final stage transfer transistor gate signal generating circuit for generating a final stage transfer transistor gate signal which is to be input to the electric charge reusing serial type charge pump circuit shown in FIG. 17.
Figure 20:
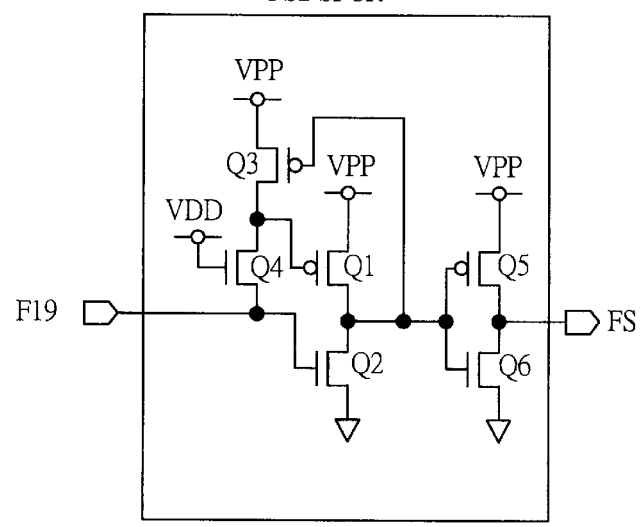
FIG. 20 is a circuit diagram of an equalizing signal generating circuit for generating an equalizing signal which is to be input to the electric charge reusing serial type charge pump circuit shown in FIG. 17.
Figure 21:
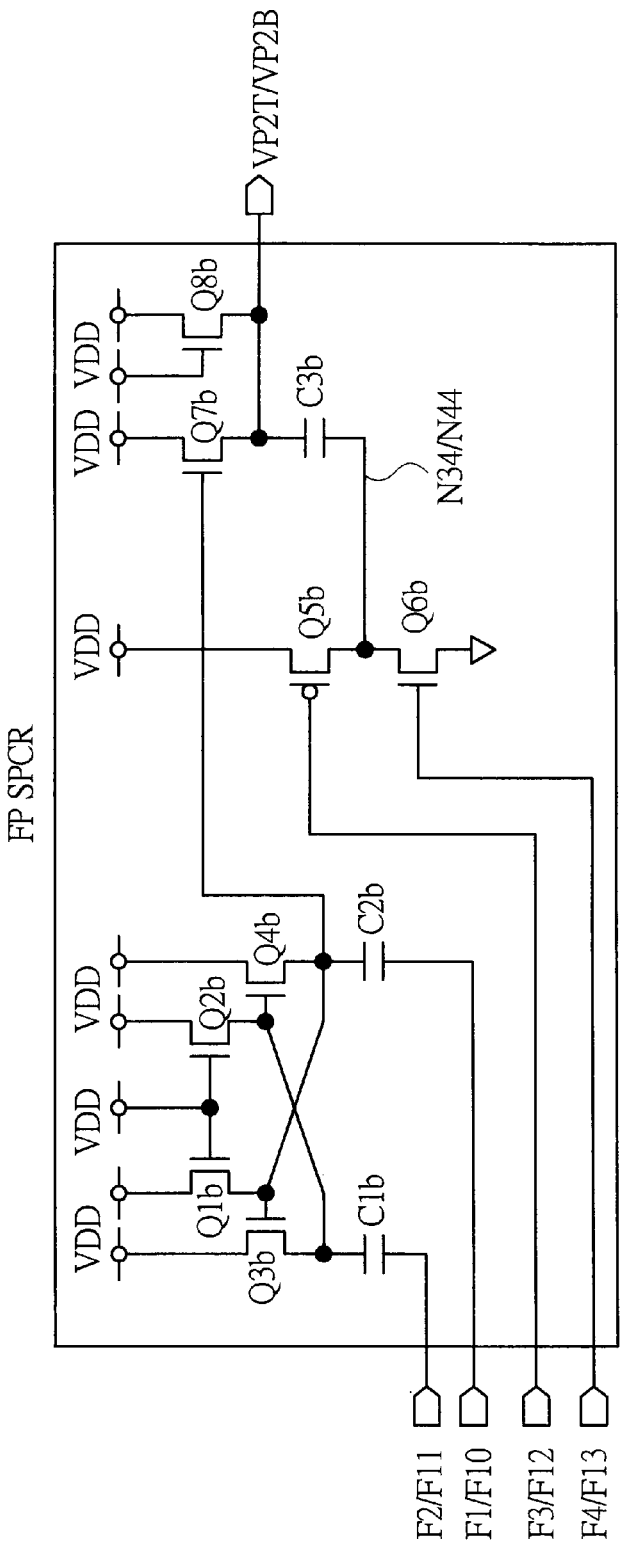
FIG. 21 is a circuit diagram of a precharge voltage generating circuit for generating a boosted capacitance precharge power source voltage used in the electric charge reusing serial type charge pump circuit shown in FIG. 17.
Figure 22:
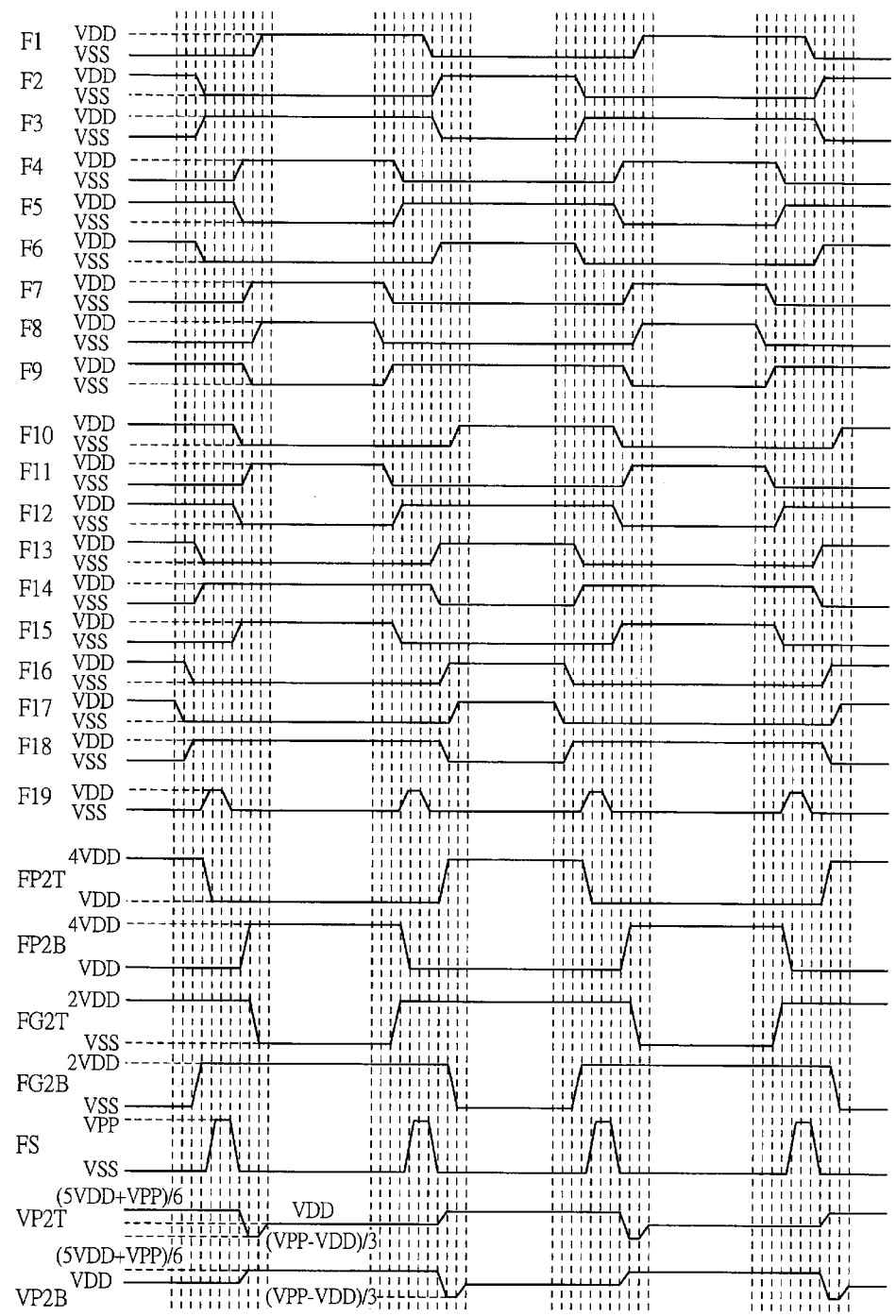
FIG. 22 is a timing chart of various signals of the electric charge reusing serial/parallel type charge pump circuit shown in FIG. 17.
Figure 23:
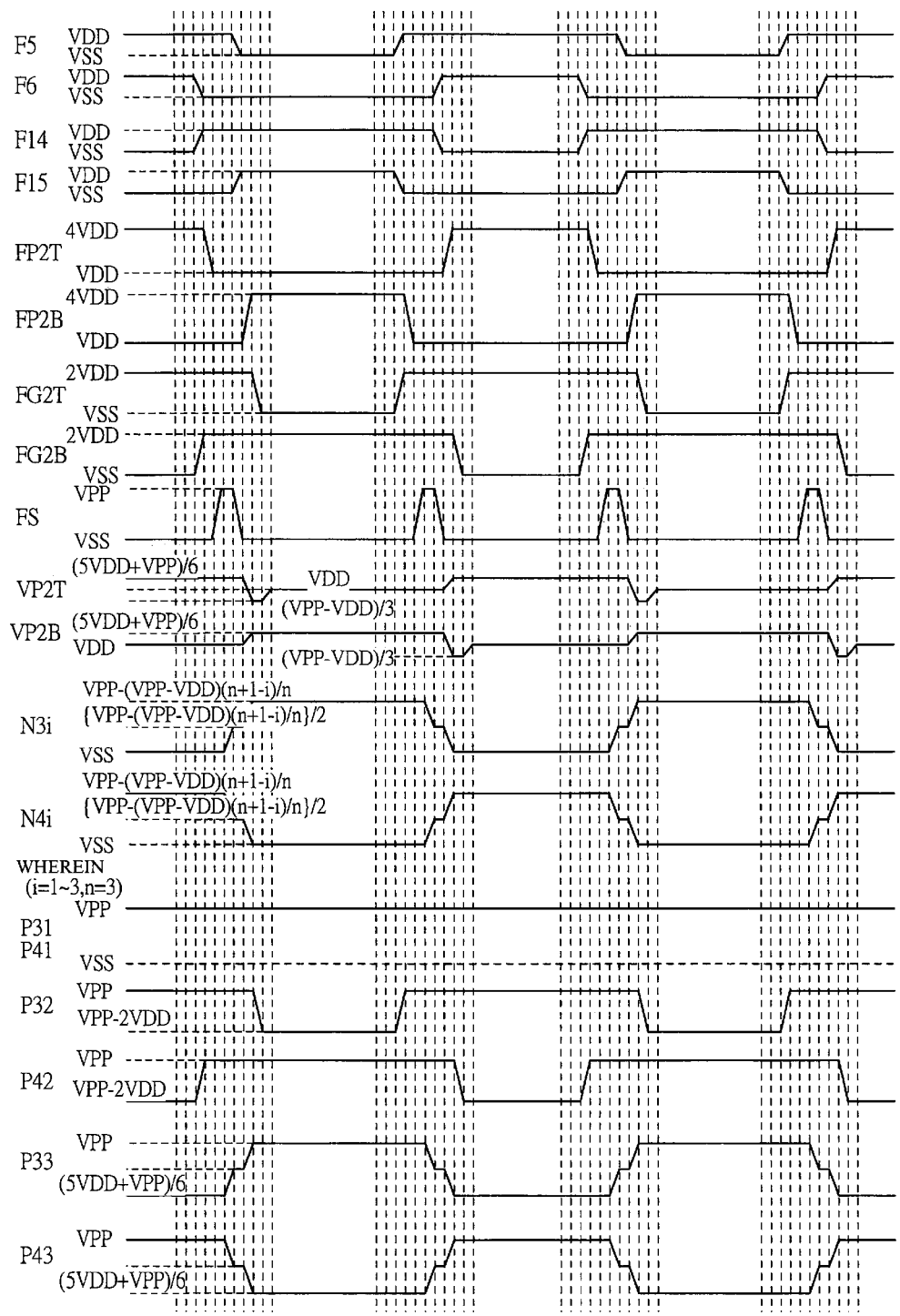
FIG. 23 is a timing chart of other various signals of the electric charge reusing serial/parallel type charge pump circuit shown in FIG. 17.
Figure 24:
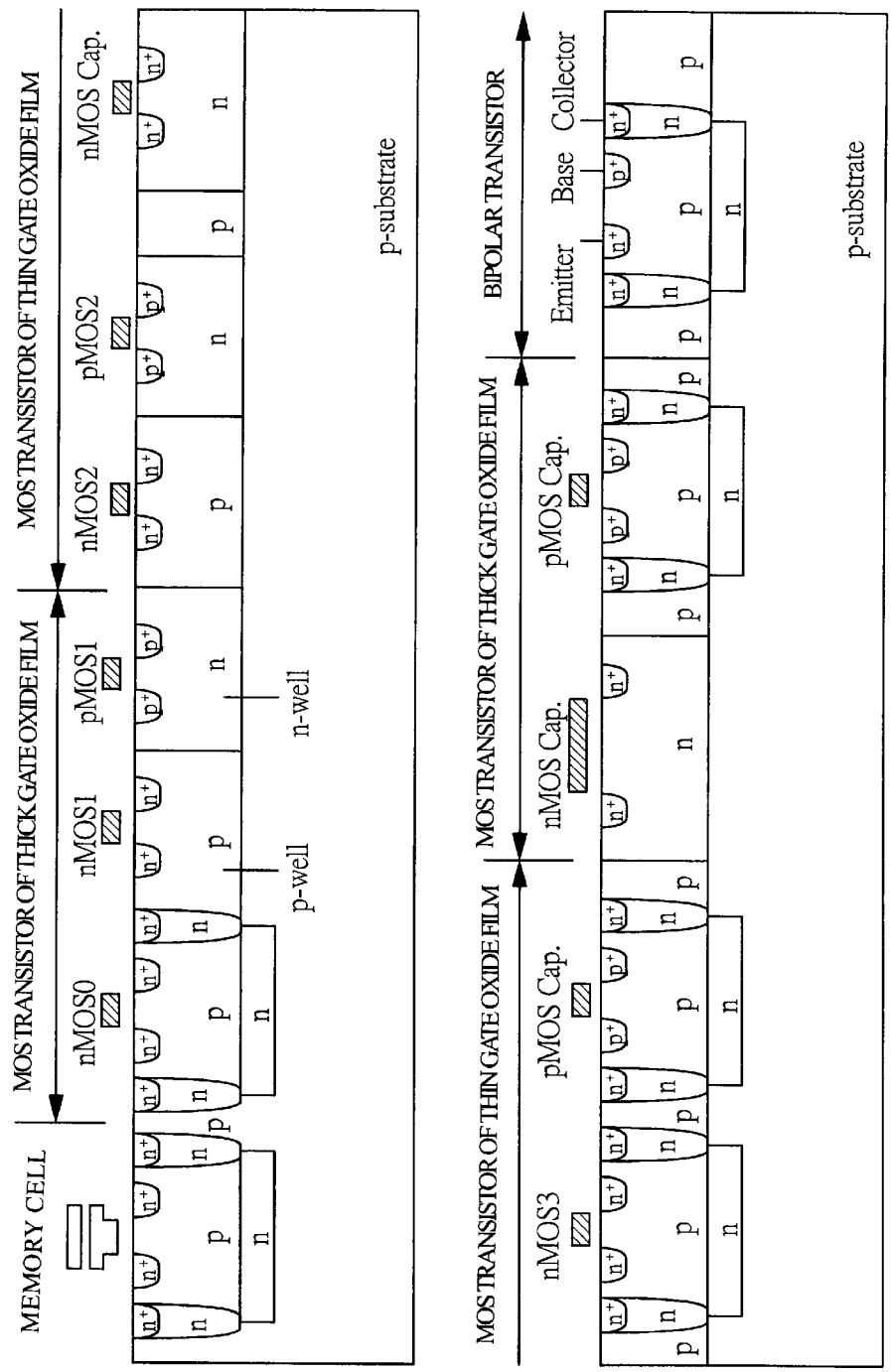
Figure 25A:
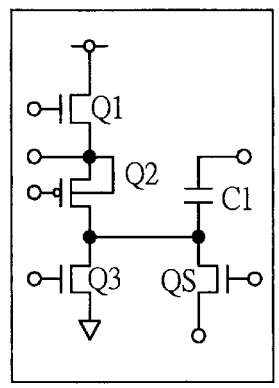
FIG. 25A shows an equivalent circuit of the unit cell.
Figure 25B:
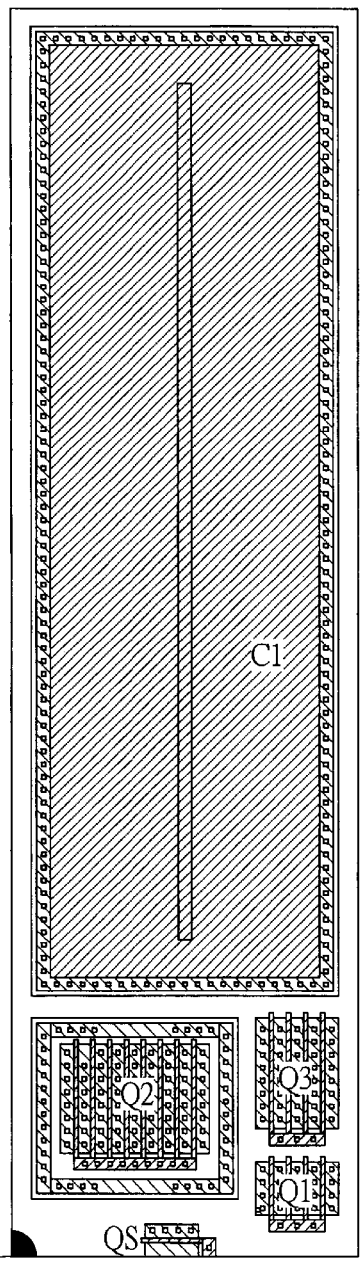
FIG. 25B shows a layout example of the unit cell and FIG. 25C shows an example of arrangement of the unit cell.
Figure 25C:
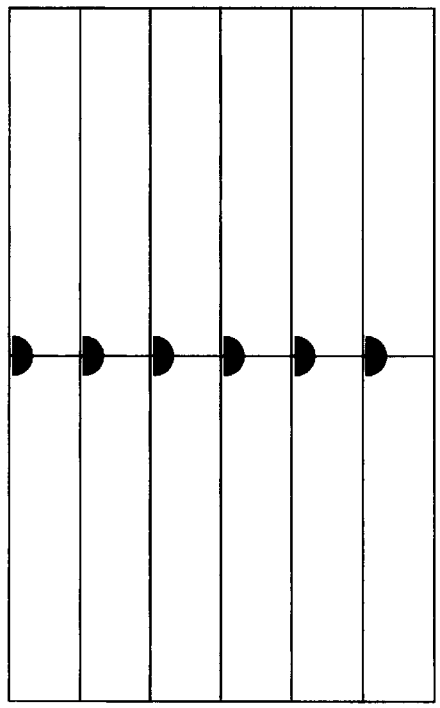
Figure 26:
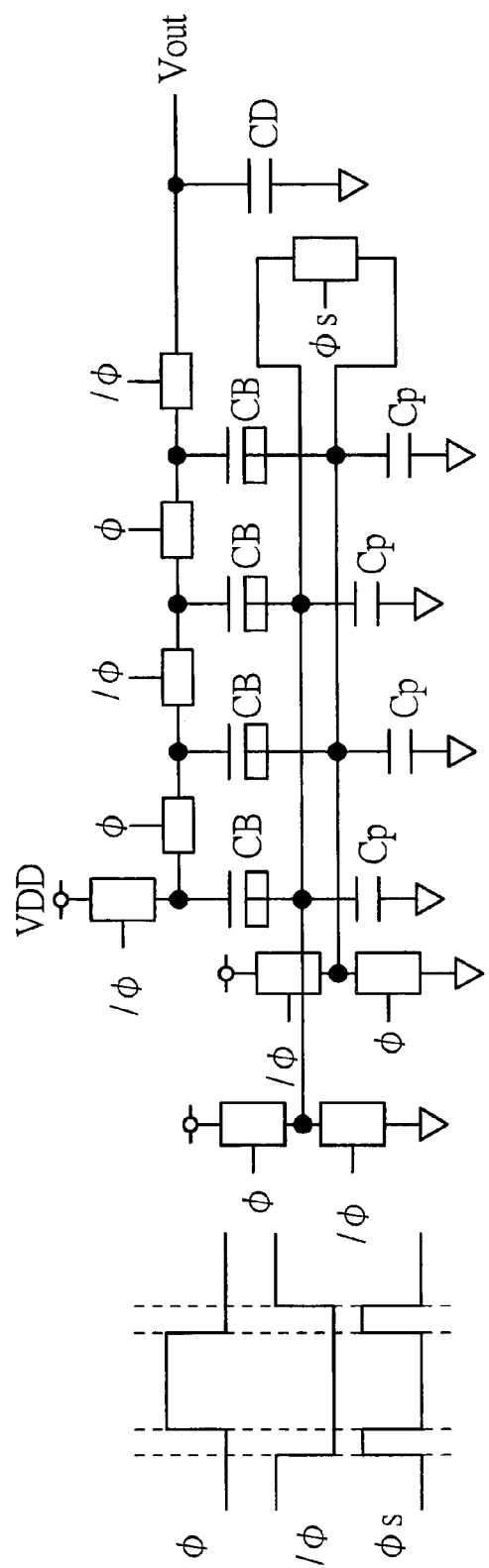
FIG. 26 is a schematic circuit diagram showing an electric charge reusing parallel type charge pump circuit studied by the present inventors.

FIG. 1 is an explanatory diagram of an IC card according to an embodiment of the present invention, FIG. 2 is a block diagram of a semiconductor integrated circuit device provided in the IC card shown in FIG. 1, FIG. 3 is a schematic block diagram of a flash memory provided in the semiconductor integrated circuit device shown in FIG. 2, FIG. 4 is a schematic circuit diagram of an electric charge reusing serial type charge pump circuit according to an embodiment of the present invention, FIGS. 5 and 6 are sectional views of a capacitor used in the charge pump circuit according to an embodiment of the invention, FIG. 7 is an equivalent circuit diagram of the capacitor shown in FIGS. 5 and 6, FIG. 8 is a schematic circuit diagram of an electric charge reusing serial/parallel type charge pump circuit according to an embodiment of the invention, FIG. 9 is a schematic circuit diagram of a serial/parallel charge pump circuit according to an embodiment of the invention, FIG. 10 is an explanatory diagram showing characteristics of input current/output current-boosting rate of various charge pump circuits, FIG. 11 is a circuit diagram of an electric charge reusing serial type charge pump circuit used in an intermediate voltage charge pump circuit of the flash memory shown in FIG. 3, FIG. 12 is a circuit diagram of a precharge signal generating circuit for generating a precharge signal which is to be input to the electric charge reusing serial type charge pump circuit shown in FIG. 11, FIG. 13 is a circuit diagram of a final stage transfer transistor gate signal generating circuit for generating a final stage transfer transistor gate signal which is to be input to an electric charge reusing serial type charge pump circuit shown in FIG. 11, FIG. 14 is a circuit diagram of an equalizing signal generating circuit for generating an equalizing signal which is to be input to the electric charge reusing serial type charge pump circuit shown in FIG. 11, FIGS. 15 and 16 are timing charts of various signals in the electric charge reusing serial type charge pump circuit in FIG. 11, FIG. 17 is a circuit diagram of an electric charge reusing serial/parallel type charge pump circuit used in the intermediate voltage charge pump circuit of the flash memory shown in FIG. 3, FIG. 18 is a circuit diagram of a precharge signal generating circuit for generating a precharge signal which is to be input to the electric charge reusing serial type charge pump circuit shown in FIG. 17, FIG. 19 is a circuit diagram of a final stage transfer transistor gate signal generating circuit for generating a final stage transfer transistor gate signal which is to be input to the electric charge reusing serial type charge pump circuit shown in FIG. 17, FIG. 20 is a circuit diagram of an equalizing signal generating circuit for generating an equalizing signal which is to be input to the electric charge reusing serial type charge pump circuit shown in FIG. 17, FIG. 21 is a circuit diagram of a precharge voltage generating circuit for generating a boosted capacitance precharge power source voltage used in the electric charge reusing serial type charge pump circuit shown in FIG. 17, FIGS. 22 and 23 are timing charts of various signals of the electric charge reusing serial/parallel type charge pump circuit shown in FIG. 17, FIG. 24 is an explanatory diagram showing one example of a cross section structures of various MOS devices used in the flash memory shown in FIG. 3, FIGS. 25A–25C are an explanatory diagram showing a layout example of a unit cell used in the electric charge reusing serial type charge pump circuit shown in FIG. 11, wherein FIG. 25A shows an equivalent circuit of the unit cell, FIG. 25B shows a layout example of the unit cell and FIG. 25C shows an example of arrangement of the unit cell, and FIG. 26 is a schematic circuit diagram showing an electric charge reusing parallel type charge pump circuit studied by the present inventors.

In this embodiment, an IC card (processing system) 1 has card type outer shape and size, and stores information and carries out calculation. As shown in FIG. 1, the IC card 1 comprises a plastic card 2 having a shape of a credit card, in which a semiconductor integrated circuit device 3 such as a nonvolatile memory mounted processor is embedded.

The semiconductor integrated circuit device 3 is provided with a tape substrate 5 made of glass epoxy, and the tape substrate 5 is formed at its one surface with a plurality of terminal electrodes 4. Various data, an interruption signal, a power source voltage, a reset signal, a clock signal and the like are input to or output from the semiconductor integrated circuit device 3 via the terminal electrodes 4.

A semiconductor chip 6 is mounted on a tip-mounting surface (the other surface) of the tape substrate 5 through an adhesive or the like. A bonding pad is provided in the vicinity of periphery of the semiconductor chip 6, and the bonding pad and the rear surface of the terminal electrode 4 are connected to each other through a bonding wire 7.

The semiconductor chip 6, the bonding wire 7 and their peripheries are sealed by mold resin or the like, thereby forming a sealed portion 8.

As shown in FIG. 2, the semiconductor integrated circuit device 3 provided in the IC card 1 comprises a CPU (central processing unit) 9, a ROM 10, a RAM (volatile memory section) 11, a nonvolatile memory (nonvolatile memory section) 12, an I/O port 13, a clock producing circuit 14 and the like, and these elements are formed on one semiconductor substrate.

A layout of a processor chip when it is used in the IC card 1 is not limited to that shown in FIG. 1, and it is not limited to an outer shape such as a contact type in which a terminal is exposed outside the IC card as shown in FIG. 1, a non-contact type in which the terminal is not exposed to the IC card, a double type having both the contact type and non-contact type.

The semiconductor integrated circuit device 3 is not limited to a device having the ROM 10 and the RAM 11 shown in FIG. 2, and a device having one of the ROM and RAM, or having no ROM or RAM is included as the semiconductor integrated circuit device 3. It is only required that the semiconductor integrated circuit device 3 at least has a logic circuit such as a CPU and a nonvolatile memory into which information can be written electrically at least one time.

The CPU 9 reads out program or data stored in the nonvolatile memory 12 by a predetermined signal from outside, and carries out a predetermined processing. Data, which was generated when the CPU 9 carried out a processing and which was necessary to be stored even after the power source to be supplied to the semiconductor integrated circuit device 3 was temporarily stopped, is written into the nonvolatile memory 12.

The CPU 9 sends operation instructions to the nonvolatile memory 12 for writing the data, a voltage producing section 15 in the nonvolatile memory 12 generates a high voltage necessary to write the data into the memory cell in accordance with the writing operation instructions, and data is written. An example of such data is individual information (name of user, personal identification number or the like) in the IC card 1.

Some of data needs to be written after previously written data was erased. In this case, the CPU 9 generates a high voltage necessary to erase data which has been written into the nonvolatile memory 12, erases the already written data and then, high voltage necessary to newly write data is generated, and data is written. An example of such data is financial information (such as the balance at the bank) in the IC card 1.

The CPU 9 is a processor for controlling reading and writing operations of information in the IC card 1 and is connected to the ROM 10, the RAM 11, the nonvolatile memory 12, the I/O port 13, the clock producing circuit 14 and the like through an address bus line AB and a data bus line DB.

A controlling program for operating the CPU 9 is stored in the ROM 10 which comprises a read only memory. The RAM 11 can read and write any time, and temporarily stores input/output data and calculation data.

The nonvolatile memory 12 selects a nonvolatile memory cell into which data is written and from which data is erased in accordance with writing operation instructions and erasing operation instructions from the CPU 9. The nonvolatile memory 12 applies high voltage generated in the voltage producing section 15 to a gate electrode or a well electrode of the selected nonvolatile memory cell, and accumulates electric charge in the electric charge accumulation layer.

The I/O port 13 is a port to which data is input and from which data is output in the IC card 1. The clock producing circuit 14 produces a clock signal from an outside clock signal, and supplies the signal to modules respectively.

The voltage producing section 15 is provided in the nonvolatile memory 12 and the section 15 produces various voltages such as a high boosted voltage used for rewriting or erasing data as described above. The nonvolatile memory 12 generates a necessary voltage using a boosting circuit provided in the voltage producing section 15 in the rewriting or erasing operation with respect to the EEPROM or the memory cell of the flash memory using the EEPROM or the flash memory as a memory array.

The EEPROM and the flash memory have nitride films or floating gates (electric charge accumulation layer, hereinafter) for accumulating electric charge, and information is stored by controlling an amount of electric charge to be accumulated in the electric charge accumulation layer.

The flash memory will be explained using FIG. 3.

Flash memories can be classified into a HAND type, an AND type, a NOR type, a SST type, a split gate type and the like depending upon a connection relation of a memory cell and a structure of the memory cell.

As a writing operation to the memory cell, there are a hot electron system in which a positive high voltage is applied to a gate electrode of the memory cell, a current flows into a channel region between a source electrode and a drain electrode to generate hot electron, and the hot electron is charged into the floating gate, and an FN tunnel writing system in which a high voltage is applied to a channel gate without flowing almost no current to a channel region, and electron (electric charge) is charged into the floating gate by FN tunnel phenomenon.

In the flash memory, a threshold value voltage of the memory cell is varied depending upon an amount of electric charge charged into the floating gate, and it is possible to hold binary data and multivalue data by forming two or more threshold value voltage distributions.

An interface section is connected to a memory controller and a processor which are connected to outside, and receives a command for instructing operations such as writing/reading/erasing, and inputs and outputs data necessary for such operations.

The control section analyzes the above-described command, supplies a control signal to the voltage producing section 15, and generates a voltage necessary for respective operations. The control section accesses a memory array 28 based on the above command and address information supplied from outside, and controls the writing operation of the supplied data into the memory cell, the reading-out operation of the data from the memory cell, and the erasing operation of the data which is written in the memory cell.

In the writing operation of data into the memory cell, a positive high voltage produced in the voltage producing section 15 is supplied to a word line connected to a gate of the memory cell, data is written by the hot electron writing system or the FN tunnel writing system, the data is changed into a predetermined threshold value in accordance with the data, and it is verified.

In the erasing operation of data in the memory cell, a well layer is divided for each of erasing unit (word line unit, block unit, all surface of the memory array), and a positive high voltage produced by the voltage producing section 15 is applied to the well layer to be erased.

With this, electric charge accumulated in the floating gate of the memory cell belonging to the erasing unit is pulled out by the FN tunnel phenomenon of the channel layer, and a threshold value voltage of the memory cell is changed into a voltage distribution of the erasing level.

The voltage producing section 15 comprises a negative voltage charge pump circuit (voltage generating section) 16, a high voltage charge pump circuit (voltage generating section) 17, and an intermediate voltage charge pump circuit (voltage generating section) 18 and the like.

The negative voltage charge pump circuit 16 produces a power source VEW which is a negative voltage of about −16V, and supplies the same to a word decoder 20 which decodes a line address which is input through a decoder 19.

The high voltage charge pump circuit 17 produces a power source VWW of about 15V, and supplies the same to the word decoder 20. The intermediate voltage charge pump circuit 18 produces a power source VCP of about 7V, and a power source VWD of about 5V.

The power source VCP is output to the word decoder 20, and the power source VWD supplies the same to a sense amplifier/latch circuit 22 which amplifies data output from a memory cell S of a memory array 21 and outputs the same. Data amplified by the sense amplifier/latch circuit 22 is output from a data output terminal DO through a main amplifier 23.

Here, an example of a circuit structure of the charge pump circuit which produces the power source VCP and the like will be explained briefly.

Examples of the charge pump circuit are an electric charge reusing serial type charge pump circuit in which two serial type charge pump circuits are connected to each other in parallel, an electric charge reusing serial/parallel type charge pump circuit in which two serial type charge pump circuits comprising a combination of a serial type charge pump circuit and a parallel type charge pump circuit are connected to each other in parallel, and a serial/parallel type charge pump circuit comprising a combination of a serial type charge pump circuit and a parallel type charge pump circuit.

As shown in FIG. 4, the electric charge reusing serial type charge pump circuit comprises switching elements S1 to S30 and capacitors C1 to C8 which are boosted capacities. The switching elements S1 to S30 comprise transistors.

Driving signals (first operation signals) $\phi$ are respectively input to control terminals (gates) of the switching elements S5 to S9, S14 to S17 and S23 to S26. Driving signals (second operation signals) /$\phi$ which are reversed signals of the driving signals φ are respectively input to control terminals of the switching elements S1 to S4, S10 to S13 and S18 to S22.

Equalizing signals (third operation signals) φs are respectively input to control terminals of the switching elements S27 to S30. Operations of the switching elements S1 to S30 are controlled by the driving signals φ, /φ and the equalizing signal φs with signal timing as shown in the left side of FIG. 4.

Here, as shown in FIGS. 5 and 6, the capacitors C1 to C8 comprise depression type MOS (Metal Oxide Semiconductor) transistors, and parasitic capacitance Cp is included in the capacitors C1 to C8 as shown in an equivalent circuit in FIG. 7.

Power source voltages VDD are connected to one connection portions of the switching elements S1 to S4, S9, S14 to S17 and S22. Reference potential VSS is connected to the other connection portions of the switching elements S10 to S13, and S23 to S26.

These switching element S1 to S13 and capacitor C1 to C4 constitute the first charge pump circuit, and the switching element S14 to S26 and capacitor C5 to C8 constitutes the second charge pump circuit. The switching elements S27 to S30 constitute the equalizer.

The one connection portion of the capacitor C1 and the one connection portion of the switching element S5 are connected to the other connection portion of the switching element S1. The other connection portion of the switching element S9, the one connection portion of the switching element S10 and the one connection portion of the switching element S27 are connected to the other connection portion of the capacitor C1.

The one connection portions of the switching elements S11 and S28, and the other connection portion of the capacitor C2 are connected to the other connection portion of the switching element S5. The one connection portion of the capacitor C2 and the one connection portion of the switching element S6 are connected to the one connection portion of the switching element S2.

The one connection portion of the capacitor C3 and the one connection portion of the switching element S7 are connected to the other connection portion of the switching element S3. The other connection portion of the switching element S6 and one connection portions of the switching elements S12 and S29 are connected to the other connection portion of the capacitor C3.

The one connection portion of the capacitor C4 and the one connection portion of the switching element S8 are connected to the other connection portion of the switching element S4. The other connection portion of the switching element S7 and the one connections of the switching elements S13 and S30 are connected to the other connection portion of the capacitor C4.

The one connection portion of the capacitor C5 and the one connection portion of the switching element S18 are connected to the other connection portion of the switching element S14. The other connection portions of the switching element S22 and S27 and the one connection portion of the switching element S23 are connected to the other connection portion of the capacitor C5.

The one connection portion of the capacitor C6 and the one connection portion of the switching element S19 are connected to the other connection portion of the switching element S15. The other connection portions of the switching elements S18 and S28 and the one connection portion of the switching element S24 are connected to the other connection portion of the capacitor C6.

The one connection portion of the capacitor C7 and the one connection portion of the switching element S20 are connected to the other connection portion of the switching element S16. The other connection portions of the switching elements S19 and S29 and the one connection portion of the switching element S25 are connected to the other connection portion of the capacitor C7.

The one connection portion of the capacitor C8 and the one connection portion of the switching element S21 are connected to the other connection portion of the switching element S17. The other connection portion of the switching elements S20 and S30 and the one connection portion of the switching element S26 are connected to the other connection portion of the capacitor C8.

The other connection portion of the switching element S8 and the other connection portion of the switching element S21 are connected to each other, and the increased output voltage Vout is output from this connection portion.

In the electric charge reusing serial type charge pump circuit, an output section of the serial type charge pump circuit constituted by the switching elements S1 to S13 and the capacitors C1 to C4, and an output section of the serial type charge pump circuit constituted by the switching elements S14 to S26 and the capacitors C5 to C8 are connected to each other in parallel.

These two serial type charge pump circuits are driven by opposite phase pulses by the driving signals φ and /φ, and a period during which all of the one connection portions of the parasitic capacities Cp are temporarily brought into floating state is formed.

The parasitic capacities Cp corresponding to the switching elements S27 to S30 are short-circuited during this period and then, these nodes are charged or discharged. With this, electric charge discharged to a reference potential VSS can be charged in the next cycle, and the electric charge can be reused.

As shown in FIG. 8, in the electric charge reusing serial/parallel type charge pump circuit, the third charge pump circuit is constituted by the switching elements S31 to S40 and the capacitors CPU 9 to C11, and the fourth charge pump circuit is constituted by the switching elements S41 to S50 and the capacitors C12 to C14. Further, the equalizer is constituted by the switching elements S51 to S53.

Driving signals φ are input to the control terminals (gates) of the switching elements S31, S33, S34, S37, S40, S41, S45, S46, S48 and S49. Driving signals /φ which are reversed signals of the driving signals φ are input to the control terminals of the switching elements S32, S35, S36, S38, S39, S42 to S44, S47 and S50. Equalizing signals φs are input to the control terminals of the switching elements.

Operation of these switching elements S31 to S53 are controlled by the driving signals φ, /φ and the equalizing signal φs at signal timing shown in the left side in FIG. 8.

Power source voltages VDD are connected to the one connection portions of the switching elements S31, S32, S34, S41, S43 and S44. Reference potentials VSS are connected to the switching elements S33, S36, S39, S42, S46 and S49.

The one connection portion of the switching element S33, the other connection portion of the capacitor C9 and the one connection portion of the switching element S51 are connected to the other connection portion of the switching element S32.

The one connection portion of the capacitor C9, one connection portions of the switching elements S35 and S38 are connected to the other connection portion of the switching element S31. The other connection portion of the capacitor C10, the one connection portion of the switching element S36 and the one connection portion of the switching element S52 are connected to the other connection portion of the switching element S34.

The one connection portion of the capacitor C10, and the one connection portion of the switching element S37 are connected to the other connection portion of the switching element S35. The other connection portion of the capacitor C11, the one connection portion of the switching element S39 and the one connection portion of the switching element S53 are connected to the other connection portion of the switching element S37.

The one connection portion of the capacitor C11 and the one connection portion of the switching element S40 are connected to the other connection portion of the switching element S38.

The one connection portion of the switching element S42, the other connection portion of the capacitor C12 and the other connection portion of the switching element S51 are connected to the other connection portion of the switching element S40.

The one connection portion of the capacitor C12 and the one connection portions of the switching elements S45 and S48 are connected to the other connection portion of the switching element S43. The other connection portion of the capacitor C13, the one connection portion of the switching element S46 and the other connection portion of the switching element S52 are connected to the switching element S44.

The one connection portion of the capacitor C13 and the one connection portion of the switching element S47 are connected to the other connection portion of the switching element S45. The one connection portion of the switching element S49, the one connection portion of the switching element S53 and the other connection portion of the capacitor C14 are connected to the other connection portion of the switching element S47.

The one connection portion of the capacitor C14 and the one connection portion of the switching element S50 are connected to the other connection portion of the switching element S48. The other connection portion of the switching element S40 and the other connection portion of the switching element S50 are connected to each other, and increased output voltage Vout is output from the connection portion.

In this case also, the serial type charge pump circuit and the parallel type charge pump circuit are driven by opposite phase pulses by the driving signals φ and /φ, and a period during which all of the one connection portions of the parasitic capacities Cp are temporarily brought into floating state is formed.

The parasitic capacities Cp corresponding to the switching elements S51 to S53 are short-circuited during this period and then, these nodes are charged or discharged. With this, electric charge discharged to a reference potential VSS can be charged in the next cycle, and the electric charge can be reused.

As shown in FIG. 9, in the serial type charge pump circuit, a parallel type pump having a switching element SW1 and a capacitor CB1, and a k-stage serial type pump circuit having switching elements SW2 to SW5 and a capacitor CB2 (to CBk+1) are connected to each other in series.

In the parallel type charge pump, a power source voltage VDD is connected to one of connection portions of the switching element SW1, and one of connection portions of the capacitor CB1 is connected to the other connection portion of the switching element SW1.

These elements are connected such that a driving signal φ is input to a control terminal (gate) of the switching element SW1, and a driving signal /φ is input to the other connection portion of the capacitor CB1.

In the parallel type charge pump, the elements are connected such that a power source voltage VDD is connected to one of connection portions of the switching element SW2, and a driving signal φ is input to a control terminal of the switching element SW2.

One of connection portions of the switching element SW4 and the other connection portion of the capacitor CB2 are connected to the other connection portion of the switching element SW2. The other connection portion of the switching element SW3 and one of connection portions of the switching element SW5 are connected to one of connection portions of the capacitor CB2.

Driving signals φ are input to control terminals of the switching elements SW3 and SW4, and driving signals φ are input to control terminals of the switching elements SW2 and SW5. The other connection portion of the switching element SW1 is connected to one of connection portions of the switching element SW3.

In the serial type charge pump, the same circuit is constituted by the switching elements SW3 to SW5 and capacitor CB3 (to CBk+1).

In this type, voltage is charged to the capacitors CB2 to CBk+1 to 2VDD by the capacitor CB1 and the driving signal /φ and then, all of the k-number of boosted capacities are connected in series. Due to this, voltage of (2+1)VDD can be obtained under a condition of zero load current.

Therefore, when VDDMAX=2V, since 2VDD=4V, the maximum permissible electric field of the insulating film can be set to 5 MV/cm and a gate oxide film can be reduced as thin as 8 nm, so that an area of the film can be reduced.

Figure 33:
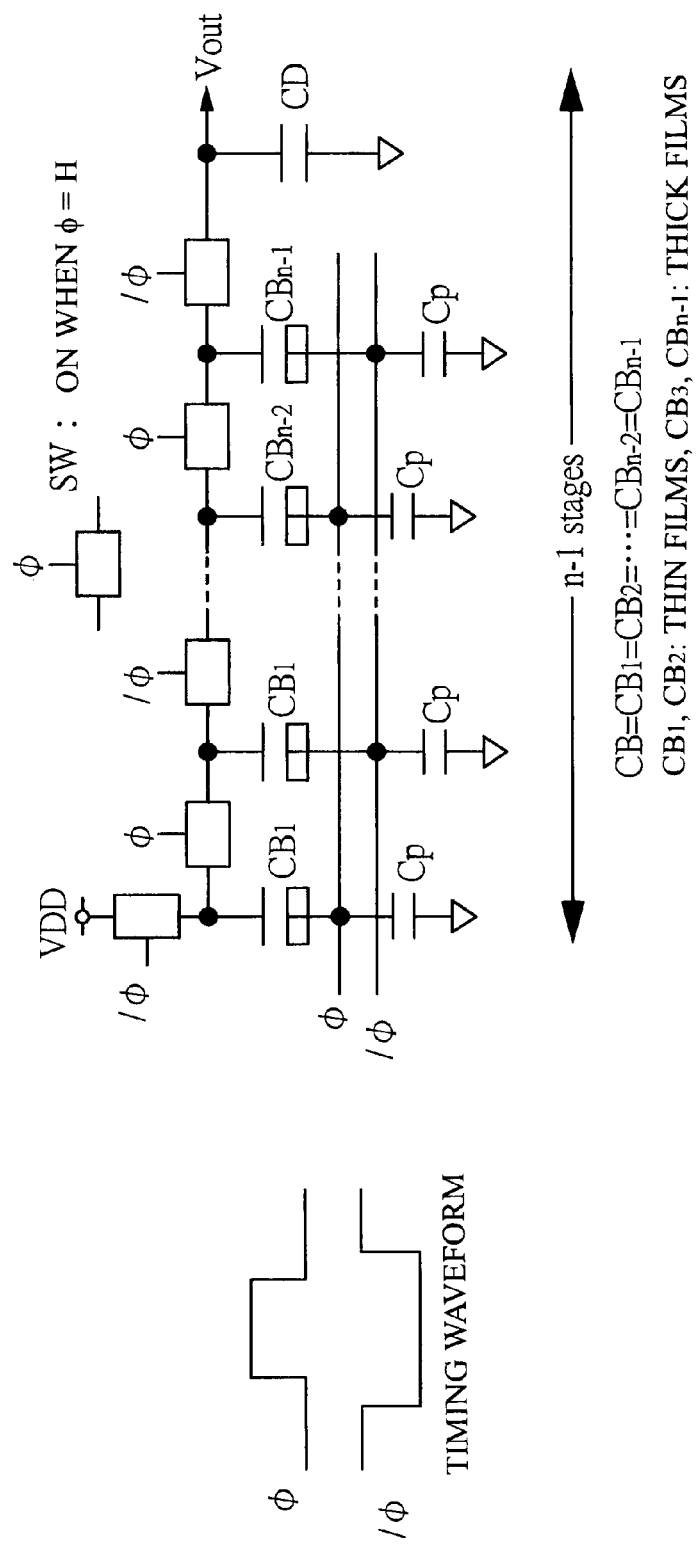
FIG. 33 is a circuit diagram showing one example of a parallel type charge pump circuit studied by the present inventors.
Figure 34:
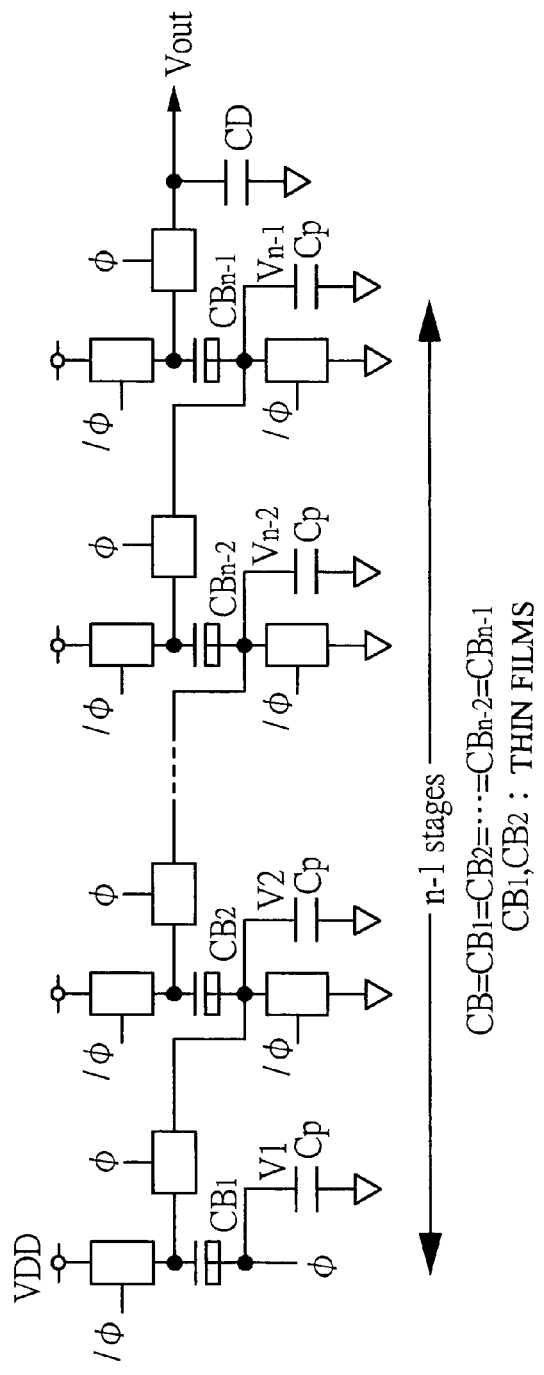
FIG. 34 is a circuit diagram showing one example of a serial type charge pump circuit studied by the present inventors.

An analysis equation is calculated out using a circuit model only having the switching elements, capacitors, parasitic capacities of the electric charge reusing serial type shown in FIG. 4, of the electric charge reusing serial/parallel type as shown in FIG. 8, of the serial/parallel type as shown in FIG. 9, of the parallel type as shown in FIG. 33 and of the serial type as shown in FIG. 34 described in the "Description of the Prior Art". A result of the calculation is shown in FIG. 10.

In FIG. 10, electrical characteristics of the serial type, the electric charge serial type, the serial/parallel type, electric charge reusing serial/parallel type, the parallel type, and the electric charge reusing parallel type are shown from a left side to a right side in the graph curved lines.

Here, the boosting rate Vout/VDD is seven times, a ratio Cp/CB of the parasitic capacitance and the boosted capacitance is 0.1 (corresponding to an MOS capacitor of tox=25 nm).

It is found from FIG. 10 that the serial type has the greatest input/output current ratio, and this ratio becomes smaller in the order of the serial/parallel type and the parallel type. This is because that a waste current charged or discharged by a parasitic capacitance CP parasitized to the boosted capacitance becomes smaller in this order.

That is, in the serial type or the serial/parallel type, a voltage from 2VDD up to (n−1)VDD is applied to the parasitic capacitance Cp, but only VDD is applied in the case of the parallel type. This is because that since the number of serially connected capacities is small, the number of parasitic capacities is also small.

In the case of the serial type, however, since the oxide film thickness of the boosted capacitance can be reduced to about half of the serial/parallel type, the number of parasitic capacities per unit area is reduced, and it is possible to obtain about the same input/output current ratio as that of the serial/parallel type.

The electric charge reusing parallel type is proposed in a dissertation (Christl Lauterbach, "Charge Sharing Concept and New Clocking Scheme for Power Efficiency and Electromagnetic Emission Improvement of Boosted Charge Pumps," IEEE JOURNAL OF SOLID-STATE CIRCUITS, VOL. 35, NO. 5, MAY 2000 PP. 719 to 723) and the like.

An outline of this circuit is shown in FIG. 26. In this system, two driving lines having opposite phases driving boosted capacitance by one charge pump circuit are temporarily be brought into a floating state, and parasitic capacities parasitized to the driving lines are short-circuited. In the parallel type, however, since the input/output current ratio is originally small, the electric charge reusing effect is also small.

From the above reason, a parallel type having the smallest input/output current ratio has a problem that is has a great occupied area, and the serial type having the smallest area has a problem that the input/output current ratio is great. In the case where a trade-off of the occupied area and the input/output current ratio are taken into consideration, it can be found that charge pumps of the electric charge reusing parallel type, of the electric charge reusing serial/parallel type, and of the serial/parallel type are practically superior.

Next, a circuit structure and operation thereof will be explained in detail where the intermediate voltage charge pump circuit 18 is constituted in the voltage producing section 15 of the nonvolatile memory 12 with use of the electric charge reusing serial type charge pump circuit.

Here, a theoretical voltage-increasing ratio of the intermediate voltage charge pump circuit 18 when no load is applied is bout seven times.

As shown in FIG. 11, the intermediate voltage charge pump circuit 18 comprises a first charge pump circuit having transistors Q11 to Q19, QIA to QIF, and capacitors C11 to C16 and CG11; and a second charge pump circuit having transistors Q21 to Q29, QIA to QIF, Q2A to Q2L, QS1 to QS6 and capacitors C21 to C26 and CG21; and a equalizer having transistors QS1 to QS6.

The transistors Q11, Q13, Q15, Q17, QIB, QID to QIF, Q21, Q23, Q25, Q27, Q29, Q2B, Q2D to Q2F comprise P-channel MOSs, and other transistors Q12, Q14, Q16, Q18, QIA, QIC, QIG to QIL, Q22, Q24, Q26, Q28, Q2A, Q2C, Q2G to Q2L comprise N-channel MOSs.

The capacitors C11 to C16, C21 to C26, CG11 and CG21 use nMOS capacities formed in nWELL shown in FIG. 6.

The transistor Q11 and the transistor Q12 are connected to each other between a power source voltage VDD and a reference potential VSS. A driving signal F4 is input to the gates of the transistors Q11 and Q13, and a driving signal F4 is input to gates of the transistors Q12, Q14, Q16, Q18, QIA and QIC1 respectively.

The other connection portion of the capacitor C11 and one of connection portions of the transistor QS1 are connected to the other connection portion of the transistor Q11. The other connection portion of the transistor QIG and one of connection portions of the transistor Q13 are connected to the one connection portion of the capacitor C11. A substrate of the transistor Q13 is also connected to the one connection portion of the capacitor C11, and a substrate voltage is applied for reducing a substrate effect.

A power source voltage VDD is connected to one of connection portions of the transistor QIG. One connection portions of the transistors Q14 and QS2 and the other connection portion of the capacitor C12 are connected to the other connection portion of the transistor Q13.

The transistors Q1H, Q15, Q16 are connected to each other in series between a power source voltage VDD and a reference potential VSS. A power source voltage VDD is connected to a gate of the transistor Q15.

One of connection portions of the capacitor C12 and a substrate of the transistor Q15 are connected to one of connection portions transistor Q15 to which the other connection portion of the transistor Q1H is connected.

The other connection portion of the capacitor C13 and one of connection portions of the transistor QS3 are connected to one of connection portions of the transistor Q16 to which the other connection portion of the transistor Q15 is connected.

The transistors Q1I, Q17, Q18 are also connected to each other in series between a power source voltage VDD and a reference potential VSS. A power source voltage VDD is connected to a gate of the transistor Q17.

One of connection portions of the capacitor C13 and a substrate of the transistor Q17 are connected to one of connection portions of the transistor Q17 to which the other connection portion of the transistor Q1I is connected.

The other connection portion of the capacitor C14 and one of connection portions of the transistor QS4 are connected to one of connection portions of the transistor Q18 to which the other connection portion of the transistor Q17 is connected.

The transistors Q1J, Q19 and QIA are also connected to each other in series between a power source voltage VDD and a reference potential VSS, and a power source voltage VDD is connected to a gate of the transistor Q19.

One of connection portions of the capacitor C14 and a substrate of the transistor Q19 are connected to one connection portions of the transistor Q19 to which the other connection portion of the transistor Q1J is connected.

The other connection portion of the capacitor C15 and one of connection portions of the transistor QS5 are connected to one of connection portions of the transistor Q1A to which the other connection portion of the transistor Q19 is connected.

The transistors Q1K, Q1B, Q1C are also connected to each other in series between a power source voltage VDD and a reference potential VSS, and a power source voltage VDD is connected to a gate of the transistor Q1B.

Further, a signal F4 is input to the transistors Q11 and Q13, and gate potentials of the transistors Q15, Q17, Q19, Q1B are fixed to a power source voltage VDD. With this, ON resistance up to the second stage transistor Q13 having low boosted voltage can be reduced, charging and discharging electric charge by gate capacitance can be reduced, and consumed current can be reduced.

One of connection portions of the capacitor C15 and a substrate of the transistor Q1B are connected to one of connection portions of the transistor Q1B to which the other connection portion of the transistor Q1K is connected.

The other connection portion of the capacitor C16 and one of connection portions of the transistor QS6 are connected to one of connection portions of the transistor Q1C to which the other connection portion of the transistor Q1B is connected.

A power source voltage VDD is connected to one of connection portions of the transistor Q1L. One of connection portions of the capacitor C16, one connection portions of the transistors Q1D and Q1F, and a gate of the transistor Q1E are connected to the other connection portion of the transistor Q1L. The transistor Q1D is used as an electric charge transfer MOS at a final stage.

A gate of the transistor Q1D, one of connection portions of the capacitor CG11 and one of connection portions of the transistor Q1E are connected to a gate of the transistor Q1D. The transistor Q1F is provided as a switch for maintaining a substrate voltage of the transistor Q1D at the highest potential.

When the transistor Q1D is ON by the capacitor CG11 connected to the gate of the transistor Q1D, the voltage is controlled to Vout-2VDD by lowering the final stage transfer transistor gate signal FGT by 2VDD input one end of the capacitor CG11, and since a level converting circuit for controlling the gate requiring Vout for a power source becomes unnecessary, consumption current can largely be reduced.

A substrate of the transistor Q1F and the other connection portion and substrate of the transistor Q1E are connected to the other connection portion of the transistor Q1F. The final stage transfer transistor gate signal FGT is input to the other connection portion of the capacitor CG11.

A precharge signal FPT is input to gates of transistors Q1G to Q1L respectively, and equalizing signal FS are input to the transistors QS1 to QS6 respectively.

The transistors Q22 and Q21 are connected to each other in series between a reference potential VSS and a power source voltage VDD. One of the connection portions of the capacitor C21 and the other connection portion of the transistor QS1 are connected to one of connection portions of the transistor Q21 to which the other connection portion of the transistor Q22 is connected.

The transistors Q24, Q23 and Q2G are connected to each other in series between a reference potential VSS and a power source voltage VDD. The other connection portion of the capacitor C21 and a substrate of the transistor Q23 are connected to one of connection portions of the transistor Q2G to which the other connection portion of the transistor Q23 is connected. Driving signals F12 are input to gates of the transistors Q21 and Q23.

One of connection portions of the capacitor C22 and the other connection portion of the transistor QS2 are connected to one of connection portions of the transistor Q24 to which the other connection portion of the transistor Q24 is connected.

The transistors Q26, Q25 and Q2H are connected to each other in series between a reference potential VSS and a power source voltage VDD. The other connection portion of the capacitor C22 and a substrate of the transistor Q25 are connected to the other connection portion of the transistor Q25.

The other connection portion of the transistor QS3 and one of connection portions of the capacitor C23 are connected to the other connection portion of the transistor Q26. A power source voltage VDD is connected to a gate of the transistor Q25.

The transistors Q28, Q27 and Q2I are also connected to each other in series between a reference potential VSS and a power source voltage VDD. The other connection portion of the capacitor C23 and a substrate of the transistor Q27 are connected to the other connection portion of the transistor Q27.

The other connection portion of the transistor QS4 and one of connection portions of the capacitor C24 are connected to the other connection portion of the transistor Q28. A power source voltage VDD is connected to a gate of the transistor Q27.

The transistors Q2A, Q29 and Q2J are connected to each other in series between a reference potential VSS and a power source voltage VDD. The other connection portion of the capacitor C24 and a substrate of the transistor Q29 are connected to the other connection portion of the transistor Q29.

The other connection portion of the transistor QS5 and one of connection portions of the capacitor C25 are connected to the other connection portion of the transistor Q2A. A power source voltage VDD is connected to a gate of the transistor Q29.

The transistors Q2C, Q2B and Q2K are connected to each other in series between a reference potential VSS and a power source voltage VDD. The other connection portion of the capacitor C25 and a substrate of the transistor Q2B are connected to the other connection portion of the transistor Q2B.

Further, a signal F12 is input to the transistors Q21 and Q23, and gate potentials of the transistors Q25, Q27, Q29, Q2B are fixed to power source voltages VDD. With this, ON resistance up to the second stage transistor Q23 having low boosted voltage can be reduced, so that charging and discharging electric charge by gate capacitance can be reduced, and that consumed current can be reduced.

The other connection portion of the transistor QS6 and one of connection portions of the capacitor C26 are connected to the other connection portion of the transistor Q2C. A power source voltage VDD is connected to a gate of the transistor Q2B.

One connection portions of the transistors Q2D, Q2F, Q2L and a gate of the transistor Q2E are connected to the other connection portion of the capacitor C26. A power source voltage VDD is connected to the other connection portion of the transistor Q2L. The transistor Q2D is also used as the final stage electric charge transfer MOS like the transistor Q1D.

The final stage transfer transistor gate signal FGB is input to one of connection portions of the capacitor CG21. Gates of the transistors Q2D and Q2F and one of connection portions of the transistor Q2E are connected to the one connection portion of the capacitor CG21.

One of connection portions and a substrate of the transistor Q2F and a substrate of the transistor Q2D are connected to the other connection portion of the transistor Q2F. The other connection portion and a substrate of the transistor Q2E are respectively connected to the other connection portion of the transistor Q2D.

The other connection portion of the transistor Q1D is connected to the other connection portion of the transistor Q2D. From this connection portion, a boosted voltage VPP is output.

Driving signals F13 are respectively input to gates of the transistors Q22, Q24, Q26, Q28, Q2A, Q2C. Precharge signals FPB are input to gates of the transistors Q2G, Q2H, Q2I, Q2J, Q2K, Q2L.

Here, the driving signals F1 to F17 in FIG. 11 can be generated from one pulse by a delay circuit or a logic circuit.

A circuit structure of a precharge signal generating circuit for producing a precharge signal FPT, (FPB) will be explained.

As shown in FIG. 12, the precharge signal-generating circuit comprises transistors Q1 to Q10, QA, QB, and capacitors C1 to C4. Power source voltages VDD are connected to one connection portions of the transistors Q1 to Q5, Q9, QA, QB. Power source voltages VDD are connected to gates of the transistors Q1, Q2 and QB.

One of connection portions of the capacitor C1, the other connection portion of the transistor Q2 and a gate of the transistor Q4 are connected to the other connection portion of the transistor Q3.

One of the connection portions of the capacitor C2, the other connection portion of the transistor Q1 and gates of the transistors Q3, Q9, QA are connected to the other connection portion of the transistor Q4.

A driving signal F2 is input to the other connection portion of the capacitor C1. A driving signal F1 is input to the other connection portion of the capacitor C2.

One of connection portions of the transistor Q6 and other connection portion of the capacitor C3 are connected to the other connection portion of the transistor Q5. The other connection portion of the transistor Q9, one of connection portions and a substrate of the transistor Q7 are respectively connected to the one connection portion of the capacitor C3.

One of connection portions of the transistor Q8 and the other connection portion of the capacitor C4 are connected to the other connection portion of the capacitor Q7. A reference potentials VSS are connected to the other connection portions of the transistors Q6 and Q8. One connection portion of the capacitor C4 is connected to the other connection portions of the transistors QA and QB.

A driving signal F3 is input to gates of the transistors Q5 to Q8. The other connection portion of the transistor QA is an output section of a precharge signal FPT.

Here, a precharge signal generating circuit for producing the precharge signal FPT has been described. Since a circuit structure of a precharge signal generating circuit for producing a precharge signal FPB is also that same, explanation thereof is omitted. When the precharge signal FPB is to be produced, driving signals F10, F9 and F11 are input instead of F2, F1 and F3.

A circuit structure of a final stage transfer transistor gate signal generating circuit for producing a final stage transfer transistor gate signal FGT will be explained.

As shown in FIG. 13, the final stage transfer transistor gate signal generating circuit comprises transistors Q1a to Q8a and capacitors C1a to C3a. These transistors Q1a to Q8a and capacitors C1a to C3a have the same circuit structures as those of the transistors Q1 to Q8 and capacitors C1 to C3 of the above-described precharge signal generating circuit, and are different therefrom in that a driving signal F7 is input to the capacitor C1a, a driving signal F6 is input to the capacitor C2a, driving signals F8 are input to gates of the transistors Q5a to Q8a, and a final stage transfer transistor gate signal FGT is output from the other connection portion of the transistor Q7a.

Further, a final stage transfer transistor gate signal generating circuit for producing a final stage transfer transistor gate signal FGT has the same circuit structure as that of the final stage transfer transistor gate signal generating circuit for producing the final stage transfer transistor gate signal FGT. Therefore, its explanation is omitted. In this case, when the final stage transfer transistor gate signal FGB is to be produced, driving signals F15, F14 and F16 are input instead of the driving signals F7, F6 and F8.

A circuit structure of an equalizing signal generating circuit for producing an equalizing signal FS will be explained.

As shown in FIG. 14, the equalizing signal generating circuit comprises transistors Q1b to Q6b. Boosted voltages VPP are connected to one connection portions of the transistors Q2b, Q4b. One of connection portions of the transistor Q3b and a gate of the transistor Q2b are connected to the other connection portion of the transistor Q4b.

A power source voltage VDD is connected to a gate of the transistor Q3b. A driving signal F17 is input to the other connection portion of the transistor Q3b and a gate of the transistor Q1b are input. A reference potential VSS is connected to the other connection portion of the transistor Q1b.

The other connection portion of the transistor Q2b, one of connection portions of the transistor Q1b and gates of the transistors Q5b and Q6b are connected to a gate of the transistor Q4b.

The transistors Q6b and Q5b has CMOS structures in which they are connected to each other in series between the boosted voltage VPP and the reference potential VSS, and an equalizing signal FS is output from the other connection portion of the transistor Q6b. This system has a merit that since a high voltage is obtained from the boosted voltage VPP which is pump circuit, the circuit structure is simple and an area thereof can be reduced.

The equalizing signal FS can be formed using a serial type charge pump circuit (except the final stage transfer transistor section) which has the same structure as that of an upper half or a lower half of the circuit shown in FIG. 11.

When the same circuit as the upper half is used for example, a signal having an opposite phase from the driving signal F17 is input instead of the driving signals F4 and F5, and a node N14 or a node N15 is used as output of the equalizing signal FS. This system has a merit that since a current is not taken out from the boosted voltage VPP which is output of the pump circuit, electric power efficiency is high.

The operation of the intermediate voltage charge pump circuit 18 constituted by the electric charge reusing serial type charge pump circuit will be explained using FIGS. 11 to 14 and timing charts in FIGS. 15 and 16.

FIG. 15 shows signal timings of the driving signals F1 to F17, the precharge signals FPT, FPB, final stage transfer transistor gate signals FGT, FGB and the equalizing signal FS in this order from an upper portion to a lower portion in the drawing.

In FIG. 16, signal timings of the driving signals F4, F5, F12, F13, precharge signals FPT, FPB, the final stage transfer transistor gate signals FGT, FGB, the equalizing signal FS, the nods N1i, N2i in FIG. 11 (here, i=1 to 6), and nodes P11, P21, P12, P22, P13, P23 in FIG. 11 are shown in this order from an upper portion to lower portion in the drawing.

Further, a theoretical voltage-increasing ratio of the intermediate voltage charge pump circuit 18 when no load is applied is bout seven times.

An upper half of the charge pump circuit charges the capacitors C3 and C4 during a period when the driving signals F1 and F3 (see FIG. 12) are at Hi level. At that time, the driving signals F4 and F5, and the precharge signal FPT are at Lo level, transistor Q11, Q13, Q15, Q17, Q19, Q1B are in conductive state, and the capacitors C11 to C16 are connected in series, i.e., in a voltage-boosting mode.

At this time, the driving signals F6 and F8 are at Hi level, a gate voltage of the transistor Q1D which is a electric charge transfer MOS is reduced to Vout-2VDD from the output voltage Vout by coupling with the capacitor CG11. That is, the transistor Q1D is brought into ON state, and transfers the electric charge to the output side.

At that time, the driving signals F2 (FIG. 12) and F7 (FIG. 13) are at Lo level. The lower half and the upper half of the charge pump circuit are reversed, and when the driving signals F9 and F11 are at Lo level, the capacitors C3 and C4 are connected to each other in series, and gates of the transistors Q2G, Q2H to Q2L for precharge are boosted in voltage to 3VDD and are turned ON. At that time, since the driving signals F12, F13 are at Hi level, transistors Q22, Q24, Q26, Q28, Q2A, Q2C are also turned ON, and electric charge is charged into the capacitors C21 to C26 from the power source voltage VDD.

The driving signals F14 and F16 are at Lo level, the final stage transfer transistor gate signal FGB is brought into Hi level (2VDD) from FIG. 13 and thus, a gate voltage of the transistor Q2D which is an electric charge transfer MOS is increased from the output voltage Vout-2VDD to Vout by coupling with the capacitor CG21.

A gate potential of the transistor Q2E is VDD which is lower than Vout and thus, the transistor Q2E is turned ON, a potential of the capacitor CG21 is reliably increased to Vout. With this, the transistor Q2D is turned OFF, and an electric charge is prevented from reversely flowing from the output side to the boosted capacitance. At that time, the driving signals F10 and F15 are at Hi level.

Next, the parasitic capacitance Cp is equalized. At that time, in the upper half charge pump circuit, the driving signals F6 and F8 are set to Lo level and the driving signal F7 is set to Hi level and then, the driving signal F4 is set to Hi level, and other signals are left as they are.

In the lower half charge pump circuit, the driving signal F10 is set to Lo level, the driving signal F11 is set to Hi level and then, the driving signal F13 is set to Lo level. Other signals are left as they are.

With this, the nodes N11 to N16 and the nodes N21 to N26 are brought into floating state in which a potential is maintained with only parasitic capacitance Cp. Here, the driving signal F17 which is an equalizing pulse is set to Hi level so that the equalizing signal FS is brought into Hi level, and potentials of the nodes N11 to N21, N12 to N22, N13 to N23, N14 to N24, N15 to N25, N16 to N26 are equalized.

In the next cycle, in the upper half charge pump circuit, the driving signals F1 and F3 are set to Lo level, the capacitors C3 and C4 in FIG. 12 are connected to each other in series, and the gates of the precharging transistors Q1G, Q1H to Q1L are boosted in voltage to 3VDD and turned ON.

At that time, the driving signal F4 is left as it is, the driving signal F5 is set to Hi level, and transistors Q12, Q14, Q16, Q18, Q1A, Q1C are also turned ON. With this, electric charge is charged to each of capacitors C11 to C16 from the power source voltages VDD.

At that time, the driving signals F6 and F8 are in Lo level states, the final step transfer transistor gate signal FGT are brought into Hi level (2VDD) from FIG. 13. Therefore, the gate voltage of the transistor Q1D which is an electric charge transfer MOS is increased from Vout-2VDD to Vout by coupling with capacitor CG11.

The gate potential of the transistor Q1E is lower than VDD and Vout and thus, the transistor Q1E is turned ON, and potential of the capacitor CG11 is reliably increased to Vout. With this, the transistor Q1D is turned OFF, and it is possible to prevent electric charge from reversely flowing from the output side toward the boosted capacitance. At that time, the driving signals F2 and F7 are at Hi level.

On the other hand, the lower half charge pump circuit charges the capacitors C3 and C4 with a driving signals F9 and F11 at Hi level. At that time, since the driving signals F12 and F13 are set to Lo level, the transistors Q21, Q23, Q25, Q27, Q29, Q2B are brought into conductive states, and all of the capacitors C21 to C26 are connected to one another in series, and a volume-boosting mode is established.

Further, the driving signals F14 and F16 in FIG. 13 are set to Hi level, the final step transfer transistor gate signal FGT is set to Lo level (reference potential VSS), and a gate voltage of the transistor Q2D which is an electric charge transfer MOS is reduced from Vout to Vout-2VDD by coupling with the capacitor CG21. With this, the transistor Q2D is turned ON, and an electric charge is transferred from the boosted capacitance to the output side. At that time, the driving signals F10 and F15 are at Lo level.

Then, the parasitic capacitance Cp is equalized. At that time, in the upper half charge pump circuit, the driving signals F2 and F5 are set to Lo level, the driving signal F3 is set to Hi level, and other signals are left as they are.

On the other hand, in the lower half charge pump circuit, the driving signal F14 is set to Lo level, the driving signal F5 is set to Hi level and then, the driving signals F16 and F12 are set to Lo level, and other signals are left as they are.

With this, the nodes N11 to N16 and nodes N21 to N26 are brought into the floating state in which the potential is maintained with only the parasitic capacitance Cp. Here, by setting the driving signal F17 which is an equalizing pulse to Hi level, an equalizing signal Fs is output, and potentials of the nodes N11–N21, N12–N22, N13–N23, N14–N24, N15–N25, N16–N26 are equalized. Thereafter, the above operation is repeated to produce increased output voltage Vout.

Next, a circuit structure of a case in which the intermediate voltage charge pump circuit 18 is constituted by the electric charge reusing serial/parallel type charge pump circuit will be explained in detail.

In this case, as shown in FIG. 17, the intermediate voltage charge pump circuit 18 comprises a third charge pump circuit having transistors Q11a to Q19a, Q1Aa to Q1Ca and capacitors C11a to C13a, CG11a; a fourth charge pump circuit having transistors Q21a to Q29a, Q2Aa to Q2Ca and capacitors C21a to C23a, CG21a and an equalizer having transistors QS1a to QS3a.

The transistors Q11a and Q12a are connected to each other in series between a power source voltage VDD and a reference potential VSS. To one connection portions of the transistors Q11a and Q12a, the other connection portion of the capacitor C11a and one of connection portions of the transistor QS1a are connected.

A boosted capacitance precharge power source voltage VP2T is connected to one of connection portions of the transistors Q17a to Q19a and to a gate of the transistor Q13a. A precharge signal FP2T is connected so as to input to the gates of the transistors Q17a to Q19a.

One of connection portions and a substrate of the transistor Q13a and one of connection portions of the capacitor C11a are connected to the other connection portion of the transistor Q17a. One of connection portions of the transistor Q14a, the other connection portion of the capacitor C12a and one of connection portions of the transistor QS2a are connected to the other connection portion of the capacitor Q13a.

One of connection portions and a substrate of the transistor Q15a and one of connection portions of the capacitor C12a are connected to the other connection portion of the transistor Q18a. One of connection portions of the transistor Q16a, the other connection portion of the capacitor C13a and one of connection portions of the transistor QS3a are connected to the other connection portion of the transistor Q15. A reference potential VSS is connected to the other connection portion of the transistor Q16a.

One of connection portions of the capacitor C13a, one connection portions of the transistors Q1Aa and Q1Ca and a gate of the transistor Q1B are connected to the other connection portion of the transistor Q19a.

Substrate of the transistors Q1Ca and Q1Aa are connected to the other connection portion of the transistor Q1Ca. A gate of the transistor Q1Aa, one of connection portions of the transistor Q1B and one of connection portions of the capacitor CG11a are connected to a gate of the transistor Q1C.

The other connection portion and a substrate of the transistor Q1Ba are respectively connected to the other connection portion of the transistor Q1Aa. A final stage transfer transistor gate signal FG2T is input to the other connection portion of the capacitor CG11a.

A driving signal F5 is input to the transistor Q11a. Driving signals F6 are input to the transistors Q12a, Q14 and Q16a. An equalizing signal FS is input to the gates of the transistors QS1a to QS3a.

The transistors Q21a to Q29a, Q2Aa to Q2Ca and capacitors C21a to C23a, CG21a have the same circuit structures as those of the above-described transistors Q11a to Q19a, Q1Aa to Q1Ca and capacitors C11a to C13a and CG11a. Therefore, only different portions will be explained.

A driving signal F15 is input to gates of the transistors Q22a, Q24a and Q26a, and a driving signal F14 is input to a gate of the transistor Q21a.

A boosted capacitance precharge power source voltage VP2B is connected to gates of the transistors Q23a and Q25a and the other connection portions of the transistors Q27a to Q29a. A precharge signal FP2B is input to gates of the transistors Q27a to Q29a. A final stage transfer transistor gate signal FG2B is input to the other connection portion of the capacitor CG21a.

The other connection portion of the transistor Q1Aa and the other connection portion of the transistor Q2Aa are connected, and a boosted voltage VPP is output from the connection portion.

Here, the driving signals F1 to F19 in FIG. 17 can be generated from one pulse by a delay circuit or a logic circuit for example.

FIG. 18 shows the precharge signal generating circuit for producing precharge signal FP2T, FP2B. FIG. 19 shows the final stage transfer transistor gate signal generating circuit for producing final stage transfer transistor gate signals FG2T and FG2B. FIG. 20 shows the equalize generating circuit for producing an equalizing signal FS. Here, the equalizing signal generating circuit can be formed using a serial type charge pump circuit (except a final stage transfer transistor) having the same structure as that of the upper half of the lower half of the circuit shown in FIG. 11, like the electric charge reusing serial type charge pump circuit.

In FIGS. 18 to 20, there is the same circuit structure as that shown in FIGS. 12 to 14 and thus, explanation thereof is omitted.

Further, a circuit structure of a precharge voltage generating circuit for producing boosted capacitance precharge power source voltages VP2T and VP2B will be explained.

A precharge voltage generating circuit to which driving signals F1 to F4 are input produces a boosted capacitance precharge power source voltage VP2T. A precharge voltage, generating circuit to which driving signals F10 to F13 are input produces a boosted capacitance precharge power source voltage VP2B.

As shown in FIG. 21, the precharge voltage generating circuit comprises transistors Q1b to Q8b and capacitors C1b to C3b. The transistor Q1b to Q6b and the capacitors C1b and C2b have the same circuit structures as that of the final stage transfer transistor gate signal generating circuit shown in FIG. 19, only the transistors Q7b and Q8b and the capacitor C3b having different connection structure will be explained.

A power source voltage VDD is connected to one of connection portions of the transistor Q7b, and one of connection portions and a gate of the transistor Q8b.

The other connection portion of the transistor Q4b is connected to a gate of the transistor Q7b. One of connection portions of the capacitor C3b and the other connection portion of the transistor Q8b are connected to the other connection portion of the transistor Q7b. The boosted capacitance precharge power source voltage VP2T, (VP2B) is output from this connection portion.

Next, the operation of the intermediate voltage charge pump circuit 18 constituted by an electric charge reusing serial/parallel type charge pump circuit will be explained using FIGS. 17 to 21 and timing charts of FIGS. 22 and 23.

In FIG. 22, signal timings of driving signal F1 to F19, precharge signal FP2T, FP2B, final stage transfer transistor gate signal FG2T, FG2B, equalizing signal FS, and boosted capacitance precharge power source voltage VP2T, VP2B are shown in this order from an upper portion to a lower portion of this drawing.

In FIG. 23, signal timings of driving signal F5, F6, F14, F15, precharge signal FP2T, FP2B, final stage transfer transistor gate signal FG2T, FG2B, equalizing signal FS, boosted capacitance precharge power source voltage VP2T, VP2B, nodes N3i, N4i (here, i=1 to 3) in FIG. 17, and notes P31, P41, P32, P42, P33, P43 in FIGS. 16(14) are shown in this order from an upper portion to a lower portion of this drawing.

In an upper half of the charge pump circuit, driving signals F1, F3, F4, F7, F8 are set to Hi level, driving signals F2, F5, F6, F9 are set to Lo level, thereby precharging the capacitor C3.

At that time, the final stage transfer transistor gate signal FG2T is brought into power source voltage VDD level and thus, the transistors Q17a and Q19a are turned OFF and the transistors Q11a, Q13a and Q15a are turned ON, and the capacitors C11a to C13a are connected to each other in series, i.e., they are brought into a voltage-boosting mode.

Further, a gate potential of the transistor Q1Aa which is an electric charge transfer MOS is reduced from Vout to Vout-2VDD like the serial type and thus, the transistor Q1Aa is turned ON, and boosted potential is transferred to output side.

At that time, in the lower half charge pump circuit, driving signals F10, F12, F13, F16, F17 are set to Lo level, and driving signals F11, F14, F15, F18 are set to Hi level. With this, the transistor Q5b in FIG. 21 is turned ON and thus, a boosted capacitance precharge power source voltage VP2T is boosted from the power source voltage VDD to 2VDD by the capacitor C3b.

On the other hand, a precharge signal FP2B as shown in FIG. 18 is boosted from a power source voltage VDD to 4VDD. With this, an electric charge from the boosted capacitance precharge power source voltage VP2T is charged into the capacitors C21a to C23a through the transistors Q27a to Q29a.

At that time, like the serial type, a gate potential of the transistor Q2Aa which is an electric charge transfer MOS is increased from Vout-2VDD to Vout and thus, the transistor Q2Aa is turned OFF, and it is possible to prevent the electric charge from reversely flowing from the output side toward the capacitor C23a.

Thereafter, the parasitic capacitance Cp is equalized. At that time, in the upper half of the charge pump circuit, the driving signals F8, F7 and F4 are set to Lo level, the driving signals F9 and F5 are set to Hi level, and other signals are left as they are.

On the other hand, in the lower half charge pump circuit, the driving signals F11 and F15 are set to Lo level, the driving signal F12 is set to Hi level, and the other signals are left as they are.

With this, the nodes N31 to N33, N41 to N43 are brought into the floating state in which the potential is maintained with only the connection portion Cp.

Then, the driving signal F19 which is an equalizing pulse is set to Hi level, thereby outputting the equalizing signal FS, and potentials of the nodes N31–N41, N32–N42, N33–N43 are equalized.

In the next cycle, Hi level and Lo level of input pulses of the driving signals F1 to F18 are reversed, and states of the upper half charge pump circuit and the lower half charge pump circuit are reversed. That is, in the upper half charge pump circuit, the capacitors C11a, C12a and C13a are brought into precharge state, boosted capacitance precharge power source voltage VP2T is set to 2VDD. In the lower half charge pump circuit, capacitors C21a, C22a and C23a are brought into a voltage-boosted state, and boosted capacitance precharge power source voltage VP2T is set to VDD. At that time, the transistor Q1Aa is turned OFF and the transistor Q2Aa is turned ON so that they exhibit functions for preventing reverse flow and for transferring electric charge.

Next, the parasitic capacitance Cp is equalized. At that time, in the upper half charge pump circuit, driving signals F2, F3 and F6 are set to Lo level, and other signals are left as they are.

In the lower half charge pump circuit, the driving signals F13, F16 and F17 are set to Lo level, the driving signals F14 and F18 are set to Hi level, and other signals are left as they are.

With this, the nodes N31 to N33, N41 to N43 are brought into the floating state in which the potential is maintained with only the connection portion Cp. Here, the driving signal F19 which is an equalizing pulse is set to Hi level, thereby outputting the equalizing signal FS, and potentials of the nodes N31–N41, N32–N42, N33–N43 are equalized. Thereafter, this operation is repeated.

Here, a short-circuiting MOS transistor is connected between nodes N34, (N44) in the precharge voltage generating circuit shown in FIG. 21, and when an equalizing signal FS produced by the equalizing signal generating circuit shown in FIG. 20 is input to a gate of the transistor, the electric charge reusing is generated also between these nodes and thus, the electricity consumption can be reduced.

FIG. 24 shows cross section structures of various MOS devices used for the flash memory.

In this case, since a voltage from 1.8V at the minimum to 16V at the maximum is applied, two kinds of films, i.e., a thick film of about 25 nm and a thin film of bout 9 nm are used for the gate insulating film. With this, four kinds of film, i.e., a PMOS and a NMOS of thick films and a PMOS and NMOS of thin films are formed.

A right film is used for a right voltage of a circuit. Further, when a triple well structure is used for a P-substrate, so that also an NMOS and a bipolar transistor isolated from the substrate can be formed.

The former one can separately change its substrate voltage and thus, it is used as an electric charge transfer transistor of a negative voltage charge pump circuit or as a precharge transistor of a boosted capacitance, and it is possible to realize a circuit having small electric charge loss by a threshold voltage.

On the other hand, the latter one can be used for a band gap voltage generating source of a band gap reference voltage generating circuit, and an output voltage of a charge pump circuit can be controlled precisely.

Further, FIG. 25 show a layout example of a unit cell used in the electric charge reusing serial type charge pump circuit. FIG. 25A shows an equivalent circuit of the unit cell, FIG. 25B shows a layout example of the unit cell and FIG. 25C shows an example of arrangement of the unit cell.

A short-circuiting transistor QS of a parasitic capacitance node designs only half of the layout in one cell. If the cell is disposed such that it becomes symmetric with respect to an X axis, it becomes one transistor.

In this type, since the same voltage is applied to all of the capacitors which are boosted capacities, one unit cell may be formed and arranged. With this, there is a merit that a period for designing the layout can be shortened. Further, since the same unit cells are used, the cells can be arranged without gaps, there is a merit that an area utilizing efficiency is enhanced.

In the case of the electric charge reusing parallel type, the number of capacitors is about three times greater, and an area can be reduced and thus, if films having different thicknesses are used in the first stage and its following stage, gaps are formed when the cells are arranged, and the area utilizing efficiency is deteriorated.

According to the embodiment, thin insulating films can be used for the capacitors used as the boosted capacities, and the input/output current rate can be controlled in a practical range. Therefore, the consumed current of the intermediate voltage charge pump circuit 18 can be suppressed in a practical range, and the layout area can be largely reduced.

Further, since the electric charge of the parasitic capacitance Cp can be used for charging the node whose voltage is boosted in the next cycle by the equalizer, boosted voltage can be produced efficiently.

Although the charge pump circuit for producing a positive boosted voltage has been described in this embodiment, a charge pump circuit for producing a negative voltage can also be realized by the serial type charge pump circuit or the serial/parallel type charge pump circuit.

In this case also, as explained above, the two circuits having the same structure are driven in opposite phases, a period during which all of the boosted capacities are brought into the floating state is formed, and during this period, when the nodes including the parasitic capacities of the boosted capacities are short-circuited, it is possible to reduce the electric charge loss by the parasitic capacities.

Figure 27:
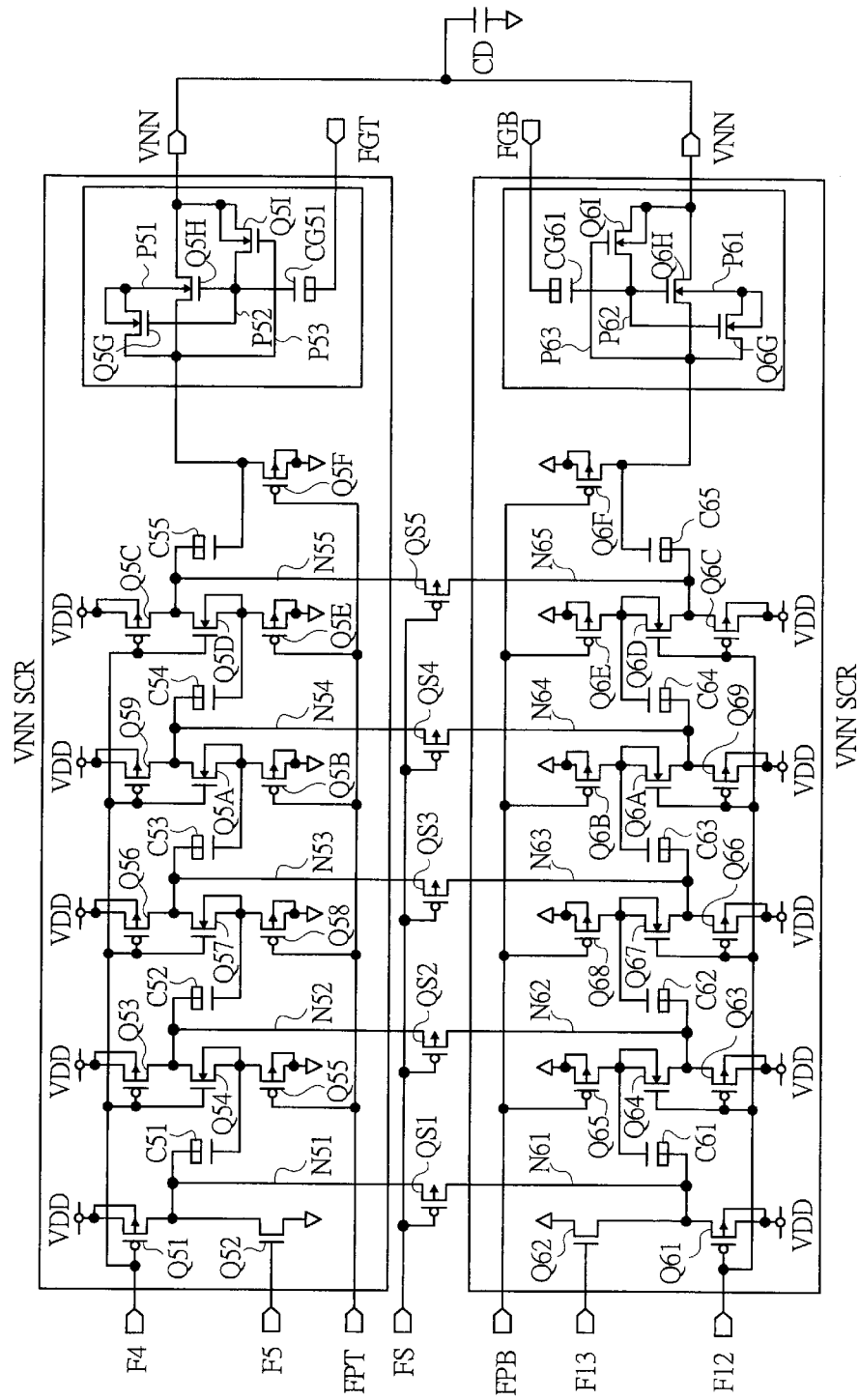
FIG. 27 is a circuit diagram showing one example of an electric charge reusing serial type charge pump circuit for producing a negative voltage according to another embodiment of the present invention.

FIG. 27 shows one example of an electric charge reusing serial type charge pump circuit for producing a negative voltage VNN. The electric charge reusing serial type charge pump circuit comprises transistors Q51 to Q59, Q5A to Q5I, Q61 to Q69, Q6A to Q6I and capacitors C51 to C55, CG51, C61 to C65, CG61.

In the case of this electric charge reusing serial type charge pump circuit is different from the previous one in that the N-channel MOS transistor is replaced by a P-channel MOS transistor in the charge pump circuit as shown in FIG. 11, and the P-channel MOS transistor is replaced by a P-channel MOS transistor, and other connecting structure is the same and thus, explanation thereof is omitted.

Figure 28:
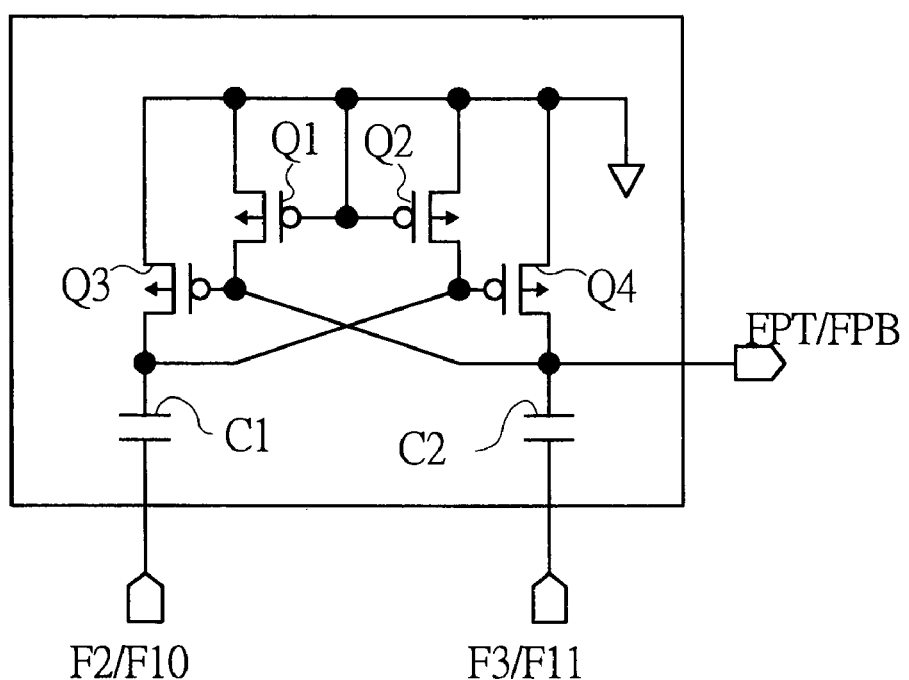
FIG. 28 is a circuit diagram of a precharge signal generating circuit for producing a precharge signal to be output to the electric charge reusing serial type charge pump circuit shown in FIG. 27.
Figure 29:
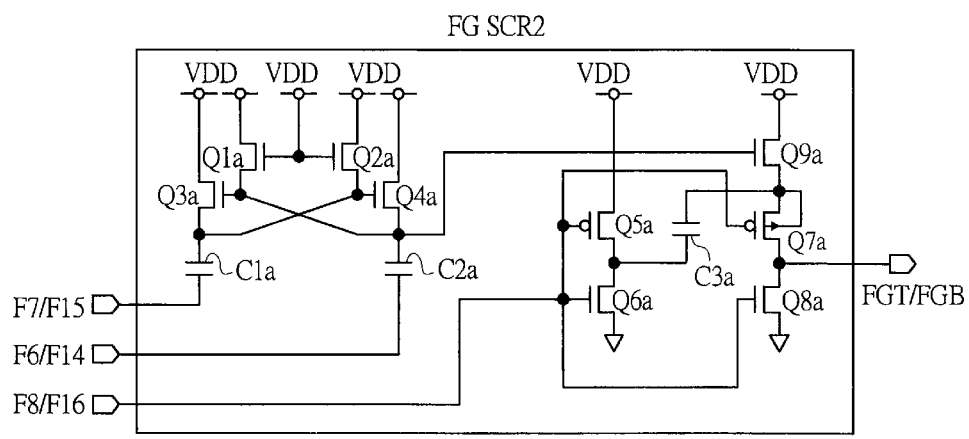
FIG. 29 is a circuit diagram of a final stage transfer transistor gate signal generating circuit for generating a final stage transfer transistor gate signal to be output to the electric charge reusing serial type charge pump circuit shown in FIG. 27.
Figure 30:
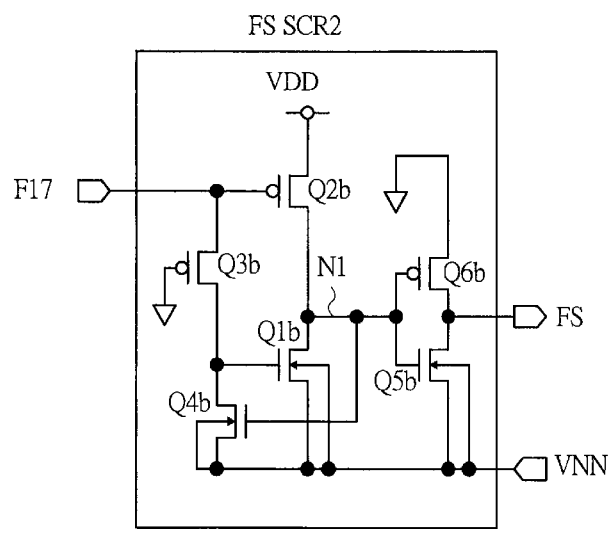
FIG. 30 is a circuit diagram of an equalizing signal generating circuit for producing an equalizing signal to be output to the electric charge reusing serial type charge pump circuit shown in FIG. 27.

FIG. 28 shows a circuit diagram of a precharge signal generating circuit, FIG. 29 shows a circuit diagram of a final stage transfer transistor gate signal generating circuit, and FIG. 30 shows a circuit diagram of an equalizing signal generating circuit.

The precharge signal generating circuit in FIG. 28 comprises transistors Q1 to Q4 and capacitors C1 and Card 2, and has the same circuit structure as the front stage circuit shown in FIG. 12, and the circuit is different therefrom in that one connecting portions of the transistors Q1 to Q4 are connected to a reference potential VSS.

A structure of the final stage transfer transistor gate signal generating circuit shown in FIG. 29 is the same as that shown in FIG. 13, explanation thereof is omitted. The equalizing signal generating circuit shown in FIG. 30 comprises transistors Q1b to Q6b like the circuit in FIG. 13, and the circuit is different from the previous one in that the N-channel MOS transistor in the circuit shown in FIG. 14 is a P-channel MOS transistor, the P-channel MOS transistor is a P-channel MOS transistor, a reference potential VSS instead of the power source voltage VDD, a power source voltage VDD instead of the reference potential VSS, and a negative voltage VNN instead of the boosted voltage VPP are connected.

Figure 31:
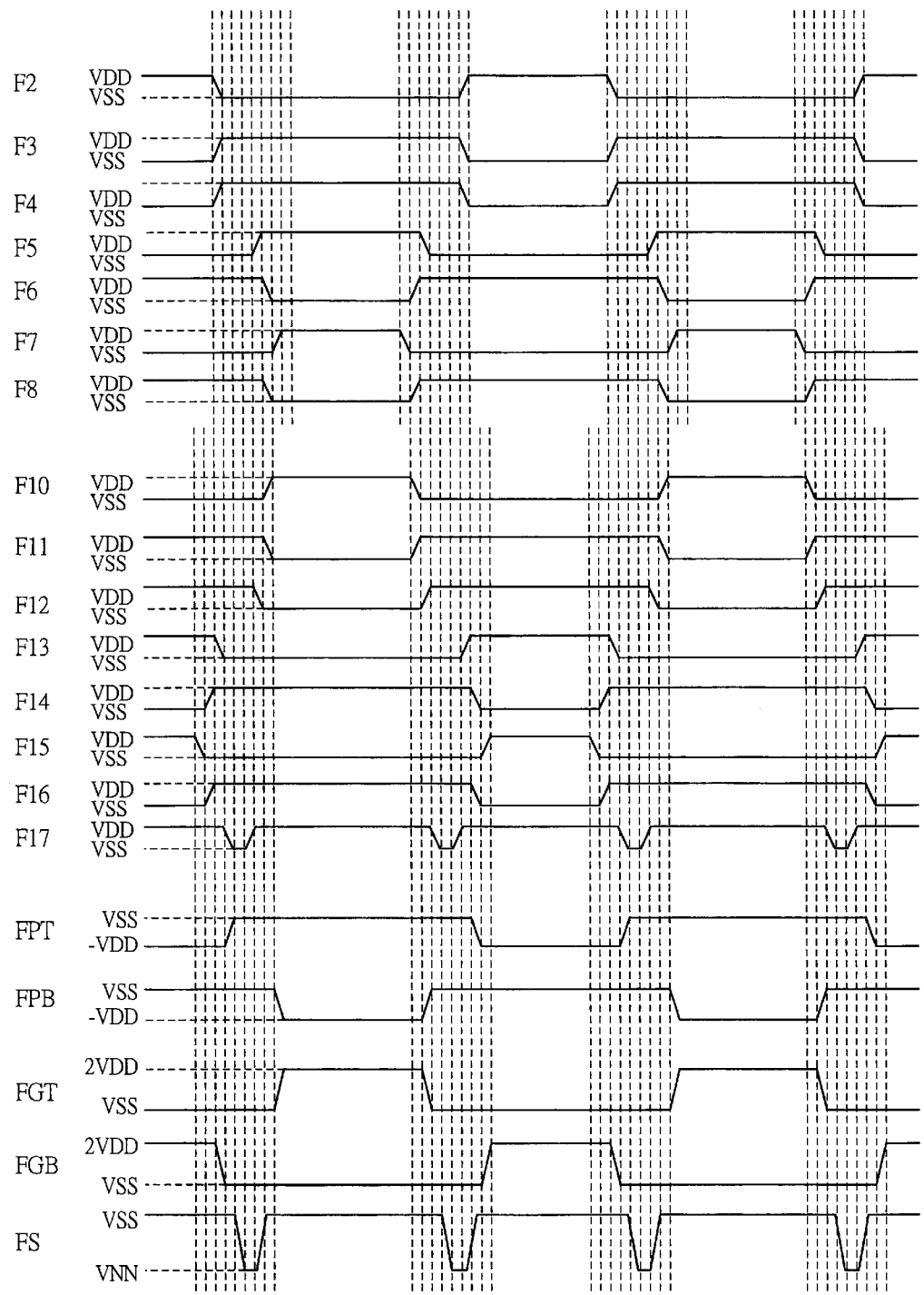
FIG. 31 is a timing chart of various signals in the electric charge reusing serial type charge pump circuit shown in FIG. 27.
Figure 32:
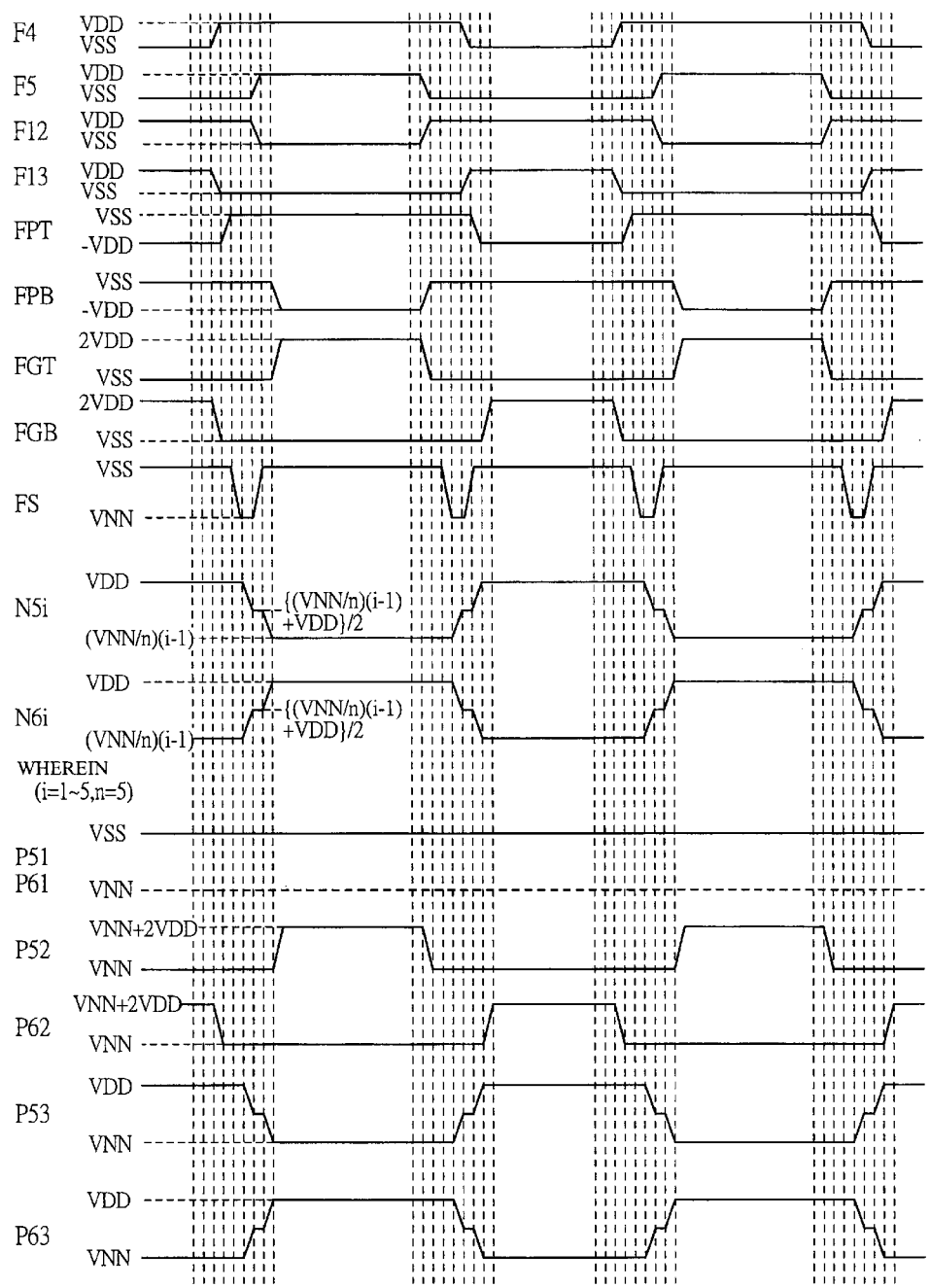
FIG. 32 is a timing chart of other various signals in the electric charge reusing serial type charge pump circuit shown in FIG. 27.

FIGS. 31 and 32 show timing charts.

In FIG. 31, signal timings of driving signals F2 to F8, F10 to F17, precharge signals FPT, FPB, final stage transfer transistor gate signals FGT, FGB, and an equalizing signal FS are shown from an upper portion to a lower portion in the drawing.

In FIG. 32, signal timing charts of driving signal F4, F5, F12, 13, precharge signal FPT, FPB, final stage transfer transistor gate signal FGT, FGB, an equalizing signal FS, nodes 5$i$ ($i$=1 to 5) in FIG. 27, a node 6$i$ ($i$=1 to 5), a node P51, a node P61, a node P53, and a node P63 are shown from an upper portion to a lower portion in the drawing.

In the electric charge reusing serial type charge pump circuit shown in FIG. 27, first, a driving signal F4 (F12) is set to a reference potential VSS, a precharge signal FPT (FPB) is set to −VDD, thereby turning on the transistors Q51, Q53, Q56, Q59, Q5C (Q61, Q63, Q66, Q69, Q6C) and transistors Q55, Q58, Q5B, Q5E, Q5F (Q65, Q68, Q6B, Q6E, Q6F), and the capacitors C51 to C55 (C61 to C65) are charged with potential of power source voltage VDD and then, one end of the capacitor C51 (C61) is grounded with the transistor Q52 (Q62), and this cycle is repeated.

When the one end of the capacitor C51 (C61) is grounded with the transistor Q52 (Q62), the gate potentials of the transistors Q54, Q57, Q5A, Q5D (Q64, Q67, Q6A, Q6D) are the reference potential VSS and source potentials when no load is applied are −VDD, −2VDD, −3VDD, −4VDD. Therefore, voltages between gate and source exceeds the threshold value and the transistor is turned ON.

Therefore, the capacitors C51 to C55 (C61 to C65) are connected to one another in series, and −5VDD voltage is obtained at the maxim. A gate potential of the electric charge transfer transistor Q5H (Q6H) is vibrated between the output voltage VNN and VNN+2VDD by transistors Q5G, Q5I (Q6G, Q6I) and the final stage transfer transistor gate signal FGT (FGB) an amplitude 2VDD.

A potential when the capacitors C51 to C55 (C61 to C65) are connected to one another in series is VNN+2VDD, and a potential at the time of charging is VNN. When the number of stages is increased, greater negative voltage can be obtained. The charge cycle is the same as that of the positive voltage charge pump circuit described above. However, the equalizing transistors QS1 to QS5 comprises PMOSs, and a gate signal thereof is vibrated between VSS and VNN.

The serial/parallel type charge pump circuit for producing a negative voltage can be realized when a signal VP2T, VP2B which is vibrated between the power source voltage VDD and 2VDD shown in FIG. 20 is connected to a terminal to which the power source voltage VDD shown in FIG. 27 is applied and then vibration of the driving signal F4 is vibrated between the VSS and 2VDD.

Although the invention made by the present inventors has been explained concretely based on the embodiment, the present invention is not limited to the embodiment, and the invention can be variously modified within a range not departing from its subject matter.

For example, the embodiment has been explained under a condition that the capacitor which is the boosted capacitance uses the MOS capacitor, but the capacitor can also be constituted by a metal-insulating film-metal or polysilicon-insulating film-polysilicon on a thick oxide film formed on a silicon substrate such as LOCOS (Local Oxidization of Silicon).

In this case, since capacitance with respect to substrate is largely reduced, if this is combined with the present invention, the electric charge loss can further be reduced.

Effect obtained from representative inventions disclosed in this application are as follows:

(1) A thin insulating film can be used in a capacitor used as a boosted capacitance, and the input/output current rate can be controlled within a practical range. Therefore, it is possible to largely reduce a layout area while suppressing consumed current of the voltage generating section which produces a boosted voltage.

(2) An electric charge of a parasitic capacitance parasitized to the charge pump circuit can be used for charging of node whose voltage is increased in the next cycle by the equalizer. Therefore, the boosted voltage can efficiently be produced.

(3) From the above (1) and (2), it is possible to reduce a semiconductor integrated circuit device such as a flash memory and a processing system in size and cost, and to enhance performance thereof.

What is claimed is:

1. A nonvolatile semiconductor memory device comprising a memory array having a plurality of nonvolatile memory cells; a control section; and a voltage producing section for supplying a predetermined voltage to be supplied to said nonvolatile memory cell, wherein said memory array can store predetermined information in each of said nonvolatile memory cells;

said control section controls a writing operation for storing information in said nonvolatile memory cell, a reading-out operation for reading out the information stored in said nonvolatile memory cell, and an erasing operation for erasing the information stored in said nonvolatile memory cell;

said voltage producing section comprises an operation signal producing section for producing a predetermined voltage to be applied to the memory cells in each of said operations in accordance with control from said control section; and a plurality of voltage generating sections;

said operation signal producing section produces various operation signals to be supplied to said plurality of voltage generating sections;

said voltage generating section comprises:
a serial type first charge pump circuit for producing a boosted voltage based on a first operation signal;
a serial type second charge pump circuit for producing a boosted voltage based on a second operation signal; and
an equalizer for short-circuiting parasitic capacities of said first and second charge pump circuits based on a third operation signal during a floating state of the corresponding parasitic capacities parasitized to the boosted capacities of said first and second charge pump circuits when the boosted voltage produced by said first or second charge pump circuit is output.

2. A nonvolatile semiconductor memory device according to claim 1, wherein said equalizer comprises an MOS transistor.

3. A nonvolatile semiconductor memory device comprising a memory array having a plurality of nonvolatile memory cells; a control section; and a voltage producing section for supplying a predetermined voltage to be supplied to said nonvolatile memory cell, wherein said memory array can store predetermined information in each of said nonvolatile memory cells;

said control section controls a writing operation for storing information in said nonvolatile memory cell, a reading-out operation for reading out the information stored in said nonvolatile memory cell, and an erasing operation for erasing the information stored in said nonvolatile memory cell;

said voltage producing section comprises an operation signal producing section for producing a predetermined voltage to be applied to the memory cells in each of said operations in accordance with control from said control section; and a plurality of voltage generating sections;

said operation signal producing section produces various operation signals to be supplied to said plurality of voltage generating sections;

said voltage generating section comprises:

a third charge pump circuit having a parallel parasitic capacitance provided at its preceding stage and a plurality of serial pump circuits connected to its following stage, said third charge pump circuit producing a boosted voltage based on the first operation signal;

a fourth charge pump circuit having a parallel parasitic capacitance provided at its preceding stage and a plurality of serial pump circuits connected to its following stage, said fourth charge pump circuit producing a boosted voltage based on the second operation signal; and an equalizer for short-circuiting parasitic capacities of said third and fourth charge pump circuits based on a third operation signal during a floating state of the corresponding parasitic capacities parasitized to the boosted capacities of said first and second charge pump circuits when the boosted voltage produced by said third or fourth charge pump circuit is output.

4. A nonvolatile semiconductor memory device according to claim 3, wherein said equalizer comprises an MOS transistor.

5. A nonvolatile semiconductor memory device comprising a memory array having a plurality of nonvolatile memory cells; a control section; and a voltage producing section for supplying a predetermined voltage to be supplied to said nonvolatile memory cell, wherein said memory array can store predetermined information in each of said nonvolatile memory cells;

said control section controls a writing operation for storing information in said nonvolatile memory cell, a reading-out operation for reading out the information stored in said nonvolatile memory cell, and an erasing operation for erasing the information stored in said nonvolatile memory cell;

said voltage producing section comprises an operation signal producing section for producing a predetermined voltage to be applied to the memory cells in each of said operations in accordance with control from said control section; and a plurality of voltage generating sections;

said operation signal producing section produces various operation signals to be supplied to said plurality of voltage generating sections;

said voltage generating section comprises a fifth charge pump circuit comprising:

a parallel type pump circuit provided at its preceding stage for generating a boosted voltage based on first and second operation signals; and serial type pump circuits connected to a following stage of said parallel pump circuit and generating a boosted voltage based on said first and second operation signals.

6. A processing system comprising a nonvolatile memory section and a central processing unit, in which an operation voltage is supplied from outside, said central processing unit can carry out a predetermined processing and can give operation instructions to said nonvolatile memory section, wherein:

said nonvolatile memory section comprises a plurality of nonvolatile memory cells for storing information, and a voltage producing section, said nonvolatile memory section accesses said plurality of nonvolatile memory cells in accordance with operation instructions from said central processing unit to store and read out information, said nonvolatile memory section gives instructions to said voltage producing section to produce a predetermined voltage in accordance with storing operation instructions of the information from said central processing unit;

said voltage producing section comprises an operation signal producing section and a plurality of voltage generating sections;

said operation signal producing section produces an operation signal to be supplied to said plurality of voltage generating sections;

said voltage generating section comprises:

a serial type first charge pump circuit for producing a boosted voltage based on a first operation signal;

a serial type second charge pump circuit for producing a boosted voltage based on a second operation signal; and an equalizer for short-circuiting parasitic capacities of said first and second charge pump circuits based on a third operation signal during a floating state of the corresponding parasitic capacities parasitized to the boosted capacities of said first and second charge pump circuits when the boosted voltage produced by said first or second charge pump circuit is output.

7. A processing system according to claim 6, wherein said equalizer comprises an MOS transistor.

8. A processing system comprising a nonvolatile memory section and a central processing unit, in which an operation voltage is supplied from outside, said central processing unit can carry out a predetermined processing and can give operation instructions to said nonvolatile memory section, wherein:

said nonvolatile memory section comprises a plurality of nonvolatile memory cells for storing information, and a voltage producing section, said nonvolatile memory section accesses said plurality of nonvolatile memory cells in accordance with operation instructions from said central processing unit to store and read out information, said nonvolatile memory section gives instructions to said voltage producing section to produce a predetermined voltage in accordance with storing operation instructions of the information from said central processing unit;

said voltage producing section comprises an operation signal producing section and a plurality of voltage generating sections;

said operation signal producing section produces an operation signal to be supplied to said plurality of voltage generating sections;

said voltage generating section comprises:
  a third charge pump circuit having a parallel parasitic capacitance provided at its preceding stage and a plurality of serial pump circuits connected to its following stage, said third charge pump circuit producing a boosted voltage based on the first operation signal;
  a fourth charge pump circuit having a serial parasitic capacitance provided at its preceding stage and a plurality of parallel pump circuits connected to its following stage, said fourth charge pump circuit producing a boosted voltage based on the second operation signal; and
  an equalizer for short-circuiting parasitic capacities of said third and fourth charge pump circuits based on a third operation signal during a floating state of the corresponding parasitic capacities parasitized to the boosted capacities of said first and second charge pump circuits when the boosted voltage produced by said third or fourth charge pump circuit is output.

9. A processing system according to claim 8, wherein said equalizer comprises an MOS transistor.

10. A processing system comprising a nonvolatile memory section and a central processing unit, in which an operation voltage is supplied from outside, said central processing unit can carry out a predetermined processing and can give operation instructions to said nonvolatile memory section, wherein:

said nonvolatile memory section comprises a plurality of nonvolatile memory cells for storing information, and a voltage producing section, said nonvolatile memory section accesses said plurality of nonvolatile memory cells in accordance with operation instructions from said central processing unit to store and read out information, said nonvolatile memory section gives instructions to said voltage producing section to produce a predetermined voltage in accordance with storing operation instructions of the information from said central processing unit;

said voltage producing section comprises an operation signal producing section and a plurality of voltage generating sections, said operation signal producing section produces an operation signal to be supplied to said plurality of voltage generating sections;

said voltage generating section comprises a fifth charge pump circuit comprising:
  a parallel pump circuit provided at its preceding stage for generating a boosted voltage based on first and second operation signals; and
  serial type pump circuits connected to a following stage of said parallel pump circuit and generating a boosted voltage based on said first and second operation signals.

* * * * *